United States Patent [19]
Hotta et al.

[11] Patent Number: 5,852,570
[45] Date of Patent: Dec. 22, 1998

[54] SEMICONDUCTOR MEMORY USING SELECT TRANSISTORS COUPLED TO SUB-BITLINES FROM DIFFERENT BLOCKS

[75] Inventors: Yasuhiro Hotta, Nara; Takeshi Nojima, Tenri; Koji Komatsu, Nara, all of Japan

[73] Assignee: Sharp Kabushiki Kaisha, Osaka, Japan

[21] Appl. No.: 866,498

[22] Filed: May 30, 1997

[30] Foreign Application Priority Data

Jun. 11, 1996 [JP] Japan ..................... 8-149615

[51] Int. Cl.⁶ .................... G11C 17/00
[52] U.S. Cl. ............... 365/104; 365/51; 365/63
[58] Field of Search .................. 365/104, 51, 63, 365/230.03

[56] References Cited

U.S. PATENT DOCUMENTS

| | | | |
|---|---|---|---|
| 5,432,730 | 7/1995 | Shubat et al. | 365/63 |
| 5,455,787 | 10/1995 | Kawasima | 365/154 |
| 5,493,527 | 2/1996 | Lo et al. | 365/185.11 |
| 5,499,215 | 3/1996 | Hatta | 365/230.03 |
| 5,506,816 | 4/1996 | Hirose et al. | 365/230.06 |

FOREIGN PATENT DOCUMENTS 6-104406  4/1994  Japan.

*Primary Examiner*—David Nelms
*Assistant Examiner*—Hien Nguyen
*Attorney, Agent, or Firm*—Morrison & Foerster, LLP

[57] ABSTRACT

The semiconductor memory device of the invention includes: a semiconductor substrate; a first block; a second block adjacent to the first block; a main bitline; a first auxiliary conductive region; a first select transistor; and a first select line. The first block includes a first memory transistor having a first electrode, a second electrode and a gate electrode; a first sub-bitline including a part functioning as the first electrode of the first memory transistor; a second sub-bitline including a part functioning as the second electrode of the first memory transistor; and a first word line including a part functioning as the gate electrode of the first memory transistor, while the second block includes: a second memory transistor having a third electrode, a fourth electrode and a gate electrode; a third sub-bitline including a part functioning as the third electrode of the second memory transistor; a fourth sub-bitline including a part functioning as the fourth electrode of the second memory transistor; and a second word line including a part functioning as the gate electrode of the second memory transistor.

22 Claims, 20 Drawing Sheets

SEMICONDUCTOR MEMORY USING SELECT TRANSISTORS COUPLED TO SUB-BITLINES FROM DIFFERENT BLOCKS

BACKGROUND OF THE INVENTION

1. Field of the Invention

The present invention relates to a semiconductor memory device, and more particularly relates to the arrangement of an array of read-only memory (ROM) cells utilizing a hierarchical bitline arrangement having two hierarchies of bitlines of main bitlines and sub-bitlines.

2. Description of the Related Art

A ROM utilizing a hierarchical bitline arrangement such as that disclosed in Japanese Laid-Open Patent Publication No. 6-104406 is one of the conventional semiconductor read-only memory (ROM) devices.

FIG. 19 is an equivalent circuit diagram of such a ROM. FIG. 20 is a diagram showing an exemplary layout pattern of such a ROM on a substrate.

In FIGS. 19 and 20, the ROM 200 is a ROM of a hierarchical bitline type and includes a semiconductor substrate 200a of a first conductivity type. The predetermined surface area of the semiconductor substrate 200a is divided into a plurality of blocks. A plurality of bank regions B0, B1, B2, etc. are provided thereon so as to correspond to the respective blocks.

For example, a first bank region B1 includes: a plurality of sub-bitlines SB1A to SB7A made of diffusion layers of the second conductivity type and formed on the semiconductor substrate 200a; a plurality of word lines WL1A, WL2A, . . . WL32A made of poly-silicon and hardwired so as to cross the respective bitlines; and a plurality of memory cells, each of which is provided between adjacent ones of the sub-bitlines and uses the associated word line as the gate electrode thereof. Herein, the memory cells M1 to M7 uses the associated word line WL2A as the gate electrode thereof.

The first bank region B1 further includes: a pair of auxiliary conductive regions BB11 and BB12 which are provided on the one terminal side of the sub-bitlines and have the same conductivity type as that of the sub-bitlines (it should be noted that, in this specification, a side where one of the two terminals of a sub-bitline is located will be referred to as "the one terminal side", e.g., in the first bank region B1 shown in FIG. 20 it means the side closer to the second bank region B2, while the side where the other terminal thereof is located will be referred to as "the other terminal side", e.g., in the first bank region B1 shown in FIG. 20 it means the side closer to the bank region B0 preceding the first bank region B1); another pair of auxiliary conductive regions BB21 and BB22 which are provided on the other terminal side of the sub-bitlines and have the same conductivity type as that of the sub-bitlines; a plurality of bank select transistors, each of which is formed between an auxiliary conductive region and a sub-bitline; and a plurality of bank select lines, each of which functions as the gate electrode of the bank select transistors associated therewith and is made of polysilicon. As shown in FIG. 20, a bank select transistor BT3A is formed between the other terminal of the sub-bitline SB2A and the auxiliary conductive region BB21, a bank select transistor BT2A is formed between the one terminal of the sub-bitline SB3A and parts of the auxiliary conductive region BB11, a bank select transistor BT1A is formed between one terminal of the sub-bitline SB5A and a part of the auxiliary conductive region BB11 and a bank select transistor BT4A is formed between the other terminal of the sub-bitline SB4A and a part of the auxiliary conductive region BB22. In addition, the bank select lines BS1A to BS4A, arranged in parallel to the word lines, function as the gates of the respective bank select transistors BT1A to BT4A.

The auxiliary conductive regions BB11 and BB12 are connected to main bitlines MB1 and MB2, implemented as metal wires, via contact holes C11 and C12, respectively, while the auxiliary conductive regions BB21 and BB22 are connected to main ground lines MG1 and MG2, implemented as metal wires, via contact holes C21 and C22, respectively.

Similarly, the second bank region B2 includes: a plurality of sub-bitlines SB1B to SB7B made of diffusion layers of the second conductivity type and formed on the semiconductor substrate 200a; a plurality of word lines WL1B, etc. made of poly-silicon and hardwired so as to cross the respective bitlines; and a plurality of memory cells M, each of which is provided between adjacent ones of the sub-bitlines and uses the associated word line as the gate electrode thereof.

In addition, the second bank region B2 shares the pair of auxiliary conductive regions BB11 and BB12, which are provided on the other terminal side of the sub-bitlines SB1B to SB7B and have the same conductivity type as that of the sub-bitlines, with the first bank region B1. In the second bank region B2, a bank select transistor BT2B is formed between the other terminal of the sub-bitline SB3B and parts of the auxiliary conductive region BB11, while a bank select transistor BT1B is formed between the other terminal of the sub-bitline SB5B and a part of the auxiliary conductive region BB11. In addition, bank select lines BS1B to BS2B, arranged in parallel to the word lines, function as the gates of the respective bank select transistors BT1B and BT2B.

In the same manner as the first and the second bank regions B1 and B2, the bank region B0 preceding the first bank region B1 also includes a plurality of sub-bitlines, a plurality of word lines and a plurality of bank select lines and shares the auxiliary conductive regions BB21 and BB22 with the first bank region B1.

Next, the operation of the ROM 200 will be briefly described.

It should be noted that the conductivity type of the semiconductor substrate is assumed to be P-type and the conductivity type of the sub-bitlines and the auxiliary conductive regions are assumed to be $N^+$-type in the following description. If the potential level on a bank select line or a word line is set high, the memory cells or the bank select transistors using the bank select line or the word line as the gate electrode thereof are selected.

In this case, the threshold value of the memory cells may be set depending upon the amount of boron ions to be implanted into the gate region. The memory cells, into which ions have been implanted, come to have a higher threshold value. Thus, if the amount of implanted ions is set to be a predetermined value, the memory cells become "OFF cells" which remain in the OFF state even when the gate potential is set at a high level. On the other hand, the other memory cells or bank select transistors, into which ions have not been implanted, become "ON cells" which transitions into the ON state when the gate potential is set at a high level.

On the other hand, the portions BAR of a bank select line, in which portions no bank select transistors are provided, are set to transition into the OFF state irrespective of the potential on the bank select line when ions are implanted thereto.

An arbitrary memory cell included within an arbitrary bank region can be selected by setting high the word line functioning as the gate electrode of the memory cell and setting high bank select lines functioning as the gate electrodes of bank select transistors associated with the sub-bitlines connected to the source and the drain of the memory cell.

For example, if a memory cell M4 in the first bank region B1 is selected, the word line WL2A and the bank select lines BS1A and BS4A are set high, thereby selecting the bank select transistors BT1A and BT4A. As a result, the associated sub-bitlines SB5A and SB4A are connected to the main bitline MB1 and the main ground line MG2 via the contact holes C11 and C22, respectively. In this case, the main ground line MG2 is connected to a ground GND (not shown) and the main bitline MB1 is connected to a data line, thereby reading the information stored in the memory cell M4.

In such a hierarchical bitline arrangement, when information stored in an arbitrary memory cell is read, the memory cell is specified by selecting predetermined bank select transistors and a predetermined word line in accordance with the bank select lines in the bank to which the desired memory cell belongs. In conventional architectures, a bank select transistor is provided for every sub-bitline, and therefore, the same number of bank select lines as that of the bank select transistors connected to common auxiliary conductive regions are required. Consequently, such a large number of bank select lines occupy a significant area of the entire array. In addition, since a main bitline is connected to a sub-bitline via a bank select transistor, the reduction in gate width of the bank select transistor results in the decrease of the bitline current so that the time required for reading the information from a desired memory cell adversely increases. Thus, the gate width of a bank select transistor is required to be as large as possible, whereas the increase in gate width causes the height of a bank region or the entire area of the memory cell array to be increased.

That is to say, the increase in gate width of a bank select transistor can increase the bitline current and enlarge a read-out margin of a memory cell. However, in conventional architectures, such a large gate width disadvantageously increases the area of a memory cell array.

SUMMARY OF THE INVENTION

The semiconductor memory device of the present invention includes: a semiconductor substrate; a first block; a second block adjacent to the first block; a main bitline; a first auxiliary conductive region; a first select transistor; and a first select line. In the semiconductor memory device, the first block includes: a first memory transistor having a first electrode, a second electrode and a gate electrode; a first sub-bitline including a part functioning as the first electrode of the first memory transistor; a second sub-bitline including a part functioning as the second electrode of the first memory transistor; and a first word line including a part functioning as the gate electrode of the first memory transistor, while the second block includes: a second memory transistor having a third electrode, a fourth electrode and a gate electrode; a third sub-bitline including a part functioning as the third electrode of the second memory transistor; a fourth sub-bitline including a part functioning as the fourth electrode of the second memory transistor; and a second word line including a part functioning as the gate electrode of the second memory transistor. The main bitline is electrically connected to the first auxiliary conductive region, the second sub-bitline is electrically connected to the fourth sub-bitline, and the first select transistor electrically connects selectively the electrically connected second and fourth sub-bitlines to the first auxiliary conductive region depending upon a potential on the first select line.

In one embodiment, the first block shares the first auxiliary conductive region with the second block.

In another embodiment, the first select transistor has a fifth electrode, a sixth electrode and a gate electrode, and a part of the first auxiliary conductive region functions as the fifth electrode, a part of the second sub-bitline and a part of the fourth sub-bitline function as the sixth electrode and a part of the first select line functions as the gate electrode of the first select transistor.

In still another embodiment, the semiconductor substrate is of a first conductivity type, and the first to the fourth sub-bitlines are of a second conductivity type.

In still another embodiment, the first block shares the first select line with the second block.

In still another embodiment, the semiconductor memory device further includes: a third block adjacent to the second block; a main ground line; a second auxiliary conductive region; and a second select transistor. The third block includes: a third memory transistor having a seventh electrode, an eighth electrode and a gate electrode; a fifth sub-bitline including a part functioning as the seventh electrode of the third memory transistor; a sixth sub-bitline including a part functioning as the eighth electrode of the third memory transistor; and a third word line including a part functioning as the gate electrode of the third memory transistor. The main ground line is electrically connected to the second auxiliary conductive region, the third sub-bitline of the second block is electrically connected to the fifth sub-bitline of the third block, and the second select transistor electrically connects selectively the electrically connected third and fifth sub-bitlines to the second auxiliary conductive region depending upon a potential on the second select line.

In still another embodiment, the second block further includes a seventh sub-bitline and a fourth memory transistor having a ninth electrode, a tenth electrode and a gate electrode, and a part of the third sub-bitline functions as the ninth electrode of the fourth memory transistor, a part of the seventh sub-bitline functions as the tenth electrode of the fourth memory transistor, and a part of the first word line functions as the gate electrode of the fourth memory transistor.

In still another embodiment, the second block further includes a third select line disposed in parallel to the first select line via the first auxiliary conductive region and a third select transistor having an eleventh electrode, a twelfth electrode and a gate electrode. A part of the first auxiliary conductive region functions as the eleventh electrode, a part of the seventh sub-bitline functions as the twelfth electrode, and a part of the third select line functions as the gate electrode of the third select transistor.

In still another embodiment, a side of the eleventh electrode of the third select transistor facing the twelfth electrode of the third select transistor is parallel to an elongation direction of the second word line.

In still another embodiment, a side of the fifth electrode of the first select transistor facing the sixth electrode of the first select transistor is parallel to an elongation direction of the third sub-bitline.

In still another embodiment, a side of the eleventh electrode of the third select transistor facing the twelfth electrode of the third select transistor is parallel to an elongation direction of the second word line, and a side of the fifth electrode of the first select transistor facing the sixth electrode of the first select transistor is parallel to an elongation direction of the third sub-bitline.

In still another embodiment, an effective channel width of the first select transistor is equal to an effective channel width of the third select transistor.

The semiconductor memory device according to another aspect of the present invention includes: a semiconductor substrate; a first block; a second block adjacent to the first block; a main bitline; a first auxiliary conductive region; a first select transistor; and a first select line. In the semiconductor memory device, the first block includes: a first memory transistor having a first electrode, a second electrode and a gate electrode; a first sub-bitline including a part functioning as the first electrode of the first memory transistor; a second sub-bitline including a part functioning as the second electrode of the first memory transistor; and a first word line including a part functioning as the gate electrode of the first memory transistor, while the second block includes: a second memory transistor having a third electrode, a fourth electrode and a gate electrode; a third sub-bitline including a part functioning as the third electrode of the second memory transistor; a fourth sub-bitline including a part functioning as the fourth electrode of the second memory transistor; and a second word line including a part functioning as the gate electrode of the second memory transistor. The main bitline is electrically connected to the first auxiliary conductive region, the second sub-bitline is electrically connected to the fourth sub-bitline, the first select transistor electrically connects selectively the electrically connected second and fourth sub-bitlines to the first auxiliary conductive region depending upon a potential on the first select line. The first block further includes: a second select transistor having a fifth electrode, a sixth electrode and a gate electrode; a third select transistor having a seventh electrode, an eighth electrode and a gate electrode; and a second select line. A part of a fifth sub-bitline functions as the sixth electrode of the second select transistor, another part of the fifth sub-bitline functions as the seventh electrode of the third select transistor, a part of the first auxiliary conductive region functions as the fifth electrode of the second select transistor, another part of the first auxiliary conductive region functions as the eighth electrode of the third select transistor, and the second and the third select transistors electrically connect selectively the first auxiliary conductive region to the fifth sub-bitline depending upon a potential on the second select line.

In one embodiment, a side of the fifth electrode facing the sixth electrode is parallel to a side of the seventh electrode facing the eighth electrode.

In another embodiment, a sum of effective channel widths of the third and the fourth memory transistors is equal to an effective channel width of the first memory transistor.

In still another embodiment, the semiconductor memory device further includes a forbidden band adjacent to the first and the third sub-bitlines.

In still another embodiment, the main bitline is electrically connected to the first auxiliary conductive region via a contact hole and the first block is opposed to the second block via the contact hole.

In still another embodiment, the main ground line is electrically connected to the second auxiliary conductive region via a contact hole and the second block is opposed to the third block via the contact hole.

Thus, the invention described herein makes possible the advantages of (1) providing a semiconductor memory device which can reduce the number of bank select lines and the area occupied by the bank select lines in a memory cell array, and (2) providing a semiconductor memory device which can still reduce the area of a memory cell array even when the gate width of a bank select transistor is enlarged.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Hereinafter, the architecture of a semiconductor memory device in the first example of the present invention will be described with reference to FIGS. 1 and 2.

Figure 1:
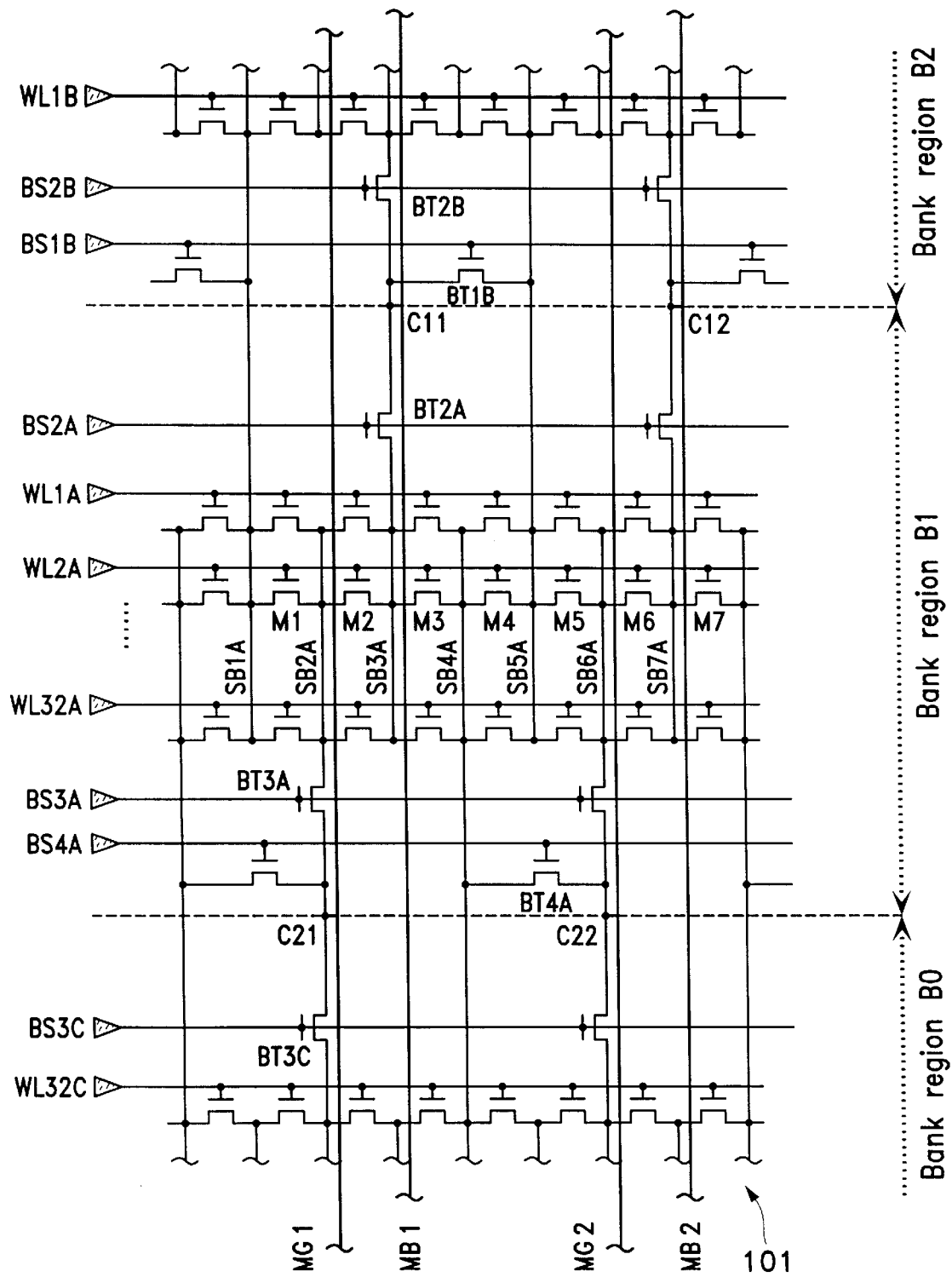
FIG. 1 is an equivalent circuit diagram of a semiconductor memory device in the first example of the present invention.

FIG. 1 is an equivalent circuit diagram of the semiconductor memory device in the first example of the present invention. FIG. 2 is a diagram showing an exemplary layout pattern of the respective layers included in the semiconductor memory device.

Figure 2:
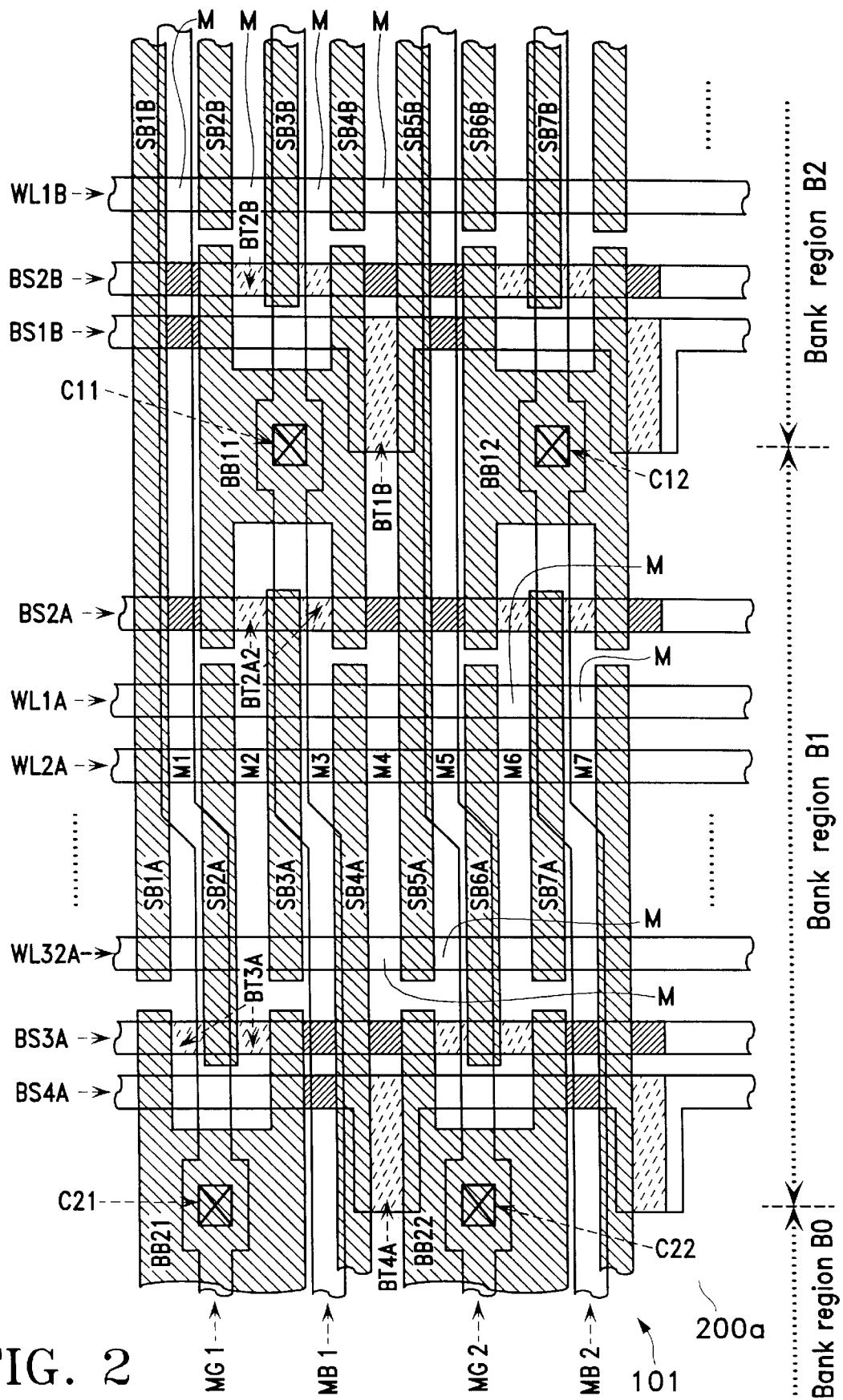
FIG. 2 is a diagram showing an exemplary layout pattern of the respective layers included in the semiconductor memory device.

In FIGS. 1 and 2, the ROM 101 is a ROM of a hierarchical bitline type of the first example and includes a P-type semiconductor substrate 200a. The predetermined surface area of the semiconductor substrate 200a is divided into a plurality of blocks. A plurality of bank regions B0, B1, B2, etc. are provided thereon so as to correspond to the respective blocks.

For example, a first bank region B1 includes: a plurality of sub-bitlines SB1A to SB7A made of $N^+$-type diffusion layers and formed on the P-type semiconductor substrate 200a; a plurality of word lines WL1A, WL2A, . . . WL32A made of poly-silicon layers and hardwired so as to cross the respective bitlines; and a plurality of memory cells M1 to M7, each of which is provided between adjacent ones of the sub-bitlines and uses the associated word line as the gate electrode thereof.

The first bank region B1 includes: a pair of auxiliary conductive regions BB11 and BB12 which are provided on the one terminal side of the sub-bitlines and have the same conductivity type as that of the sub-bitlines; another pair of auxiliary conductive regions BB21 and BB22 which are provided on the other terminal side of the sub-bitlines and have the same conductivity type as that of the sub-bitlines; a bank select transistor BT2A formed between a part of the sub-bitline SB3A and parts of the auxiliary conductive region BB11; a bank select transistor BT3A formed between a part of the sub-bitline SB2A and parts of the auxiliary conductive region BB21; a bank select transistor BT4A formed between a part of the sub-bitline SB4A and a part of the auxiliary conductive region BB22; and bank select lines BS2A to BS4A, made of poly-silicon, functioning as the gate electrodes of the respective bank select transistors BT2A to BT4A.

The auxiliary conductive regions BB11 and BB12 are connected to main bitlines MB1 and MB2, implemented as metal wires, via contact holes C11 and C12, respectively, while the auxiliary conductive regions BB21 and BB22 are connected to main ground lines MG1 and MG2, implemented as metal wires, via contact holes C21 and C22, respectively.

Similarly, the second bank region B2 includes: a plurality of sub-bitlines SB1B to SB7B made of $N^+$-type diffusion layers and formed on the semiconductor substrate 200a; a plurality of word lines WL1B, etc. made of poly-silicon and hardwired so as to cross the respective bitlines; and a plurality of memory cells M, each of which is provided between adjacent ones of the sub-bitlines and uses the associated word line as the gate electrode thereof.

In addition, the second bank region B2 shares the pair of auxiliary conductive regions BB11 and BB12, which are provided on the other terminal side of the sub-bitlines SB1B to SB7B and have the same conductivity type as that of the sub-bitlines, with the first bank region B1. In the second bank region B2, a bank select transistor BT2B is formed between a part of the other terminal of the sub-bitline SB3B and parts of the auxiliary conductive region BB11, while a bank select transistor BT1B is formed between a part of the other terminal of the sub-bitline SB5B and a part of the auxiliary conductive region BB11. In addition, the bank select lines BS1B and BS2B, arranged in parallel to the word line, function as the gates of the respective bank select transistors BT1B and BT2B.

In the same manner as the first and the second bank regions B1 and B2, the bank region B0 preceding the first bank region B1 also includes a plurality of sub-bitlines, a plurality of word lines and a plurality of bank select lines and shares the auxiliary conductive regions BB21 and BB22 with the first bank region B1.

Next, an exemplary operation of the semiconductor memory device of the first example will be briefly described.

For example, when the information stored in a memory cell M4 is read, the word line WL2A and the bank select lines BS1B and BS4A are set at a high level, thereby activating the bank select transistors BT1B and BT4A. The sub-bitline SB5A connected to the one (source or drain) terminal of the memory cell M4 is electrically connected to the main bitline MB1 via the contact hole C11, while the sub-bitline SB4A connected to the other (drain or source) terminal of the memory cell M4 is electrically connected to the main ground line MG2 via the contact hole C22. As a result, the data stored in the memory cell M4 can be read out.

Next, a more detailed configuration of the semiconductor memory device of the first example will be described.

As described above, the first bank region B1 shares the auxiliary conductive regions BB11 and BB12 with the second bank region B2 adjacent thereto. In addition, one of the sub-bitlines SB1A to SB7A of the first bank region B1 which are connected to the auxiliary conductive regions is connected to the counterpart of the sub-bitlines SB1B to SB7B of the second bank region B2 adjacent to the first bank region B1. More specifically, the sub-bitline SB1A is connected to the sub-bitline SB1B and the sub-bitline SB5A is connected to the sub-bitline SB5B.

The bank select transistor BT1B is formed between a part of the associated pair of sub-bitlines SB5A and SB5B and a part of the auxiliary conductive region BB11. A part of the bank select line BS1B functioning as the gate electrode of the bank select transistor BT1B is hardwired in parallel to the word lines. The part of the associated pair of sub-bitlines SB5A and SB5B functions as the source or the drain of the bank select transistor BT1B and the part of the auxiliary conductive region BB11 functions as the drain or the source of the bank select transistor BT1B.

In this manner, since the first and the second bank regions B1 and B2 can share a single bank select transistor BT1B, the number of bank select transistors and the bank select lines used for selecting a desired bank can be reduced. Since the gate region of the bank select transistor BT1B can be provided adjacent to the auxiliary conductive region BB11 having the contact hole C11, the channel width can be increased without increasing the area of the bank region. As a result, a larger amount of current can flow through the bitlines.

EXAMPLE 2

Hereinafter, the architecture of a semiconductor memory device in the second example of the present invention will be described with reference to FIGS. 3 and 4.

Figure 3:
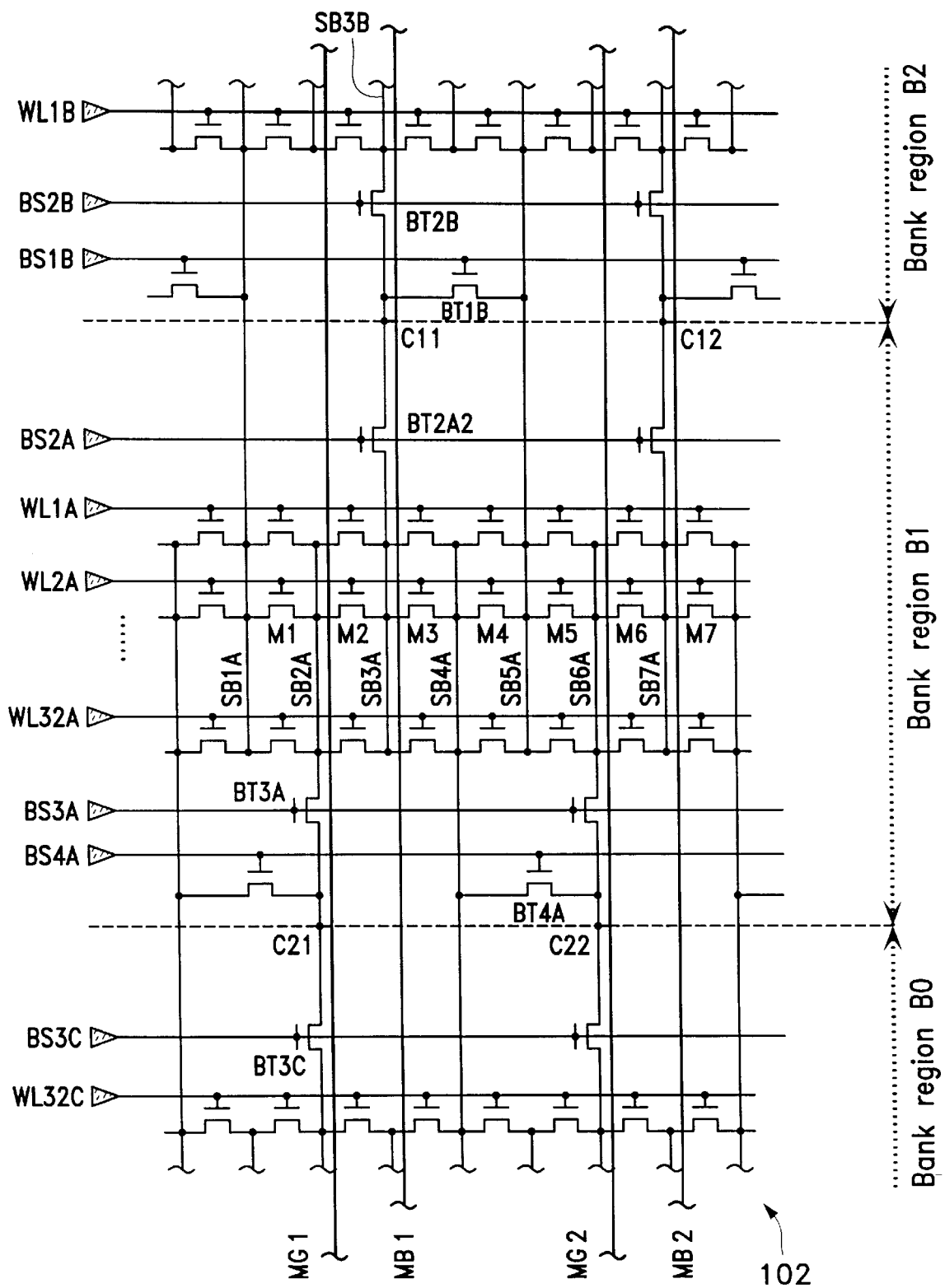
FIG. 3 is an equivalent circuit diagram of a semiconductor memory device in the second example of the present invention.

FIG. 3 is an equivalent circuit diagram of the semiconductor memory device in the second example of the present invention. FIG. 4 is a diagram showing an exemplary layout pattern of the respective layers included in the semiconductor memory device.

Figure 4:
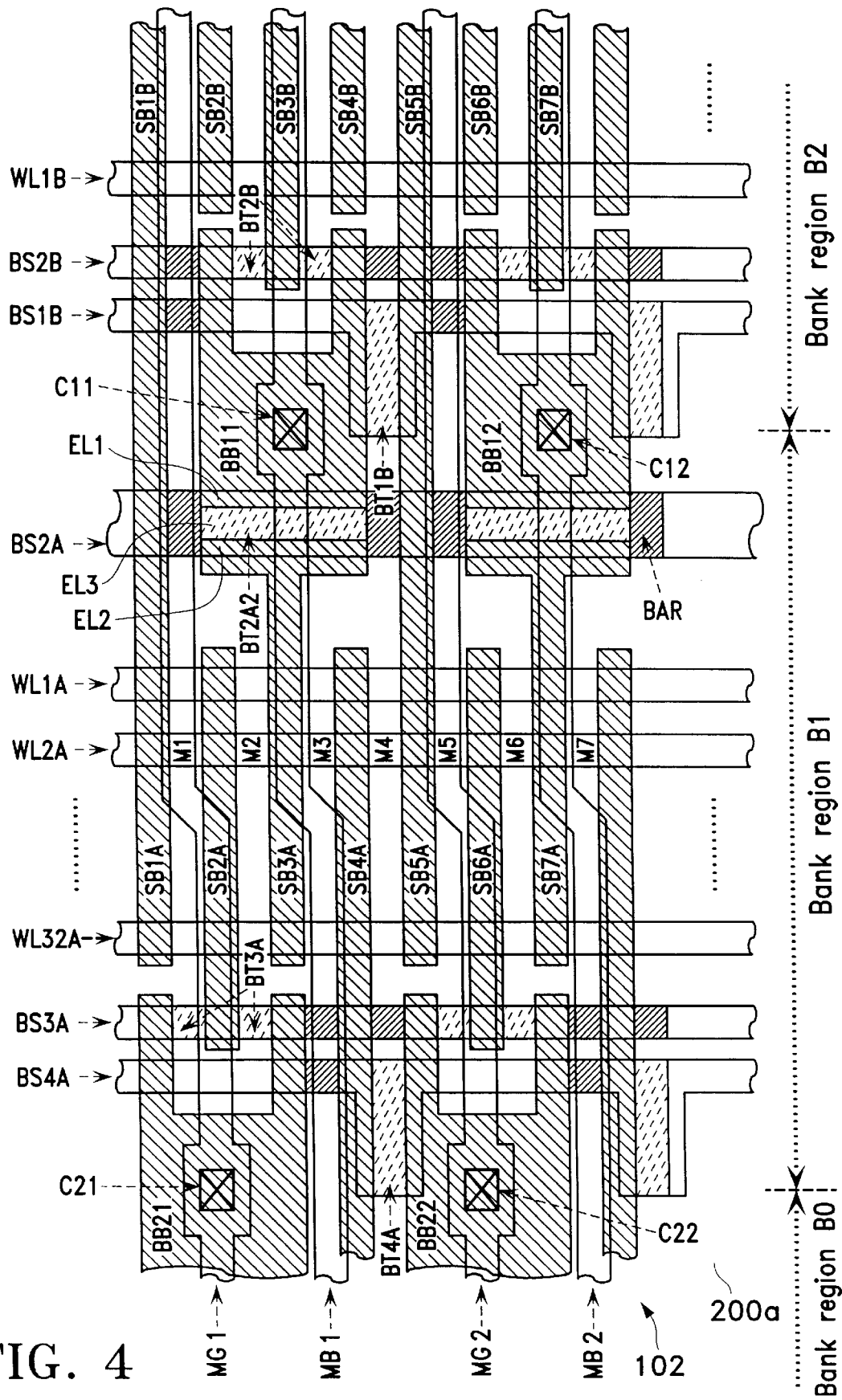
FIG. 4 is a diagram showing an exemplary layout pattern of the respective layers included in the semiconductor memory device.

In FIGS. 3 and 4, a ROM 102 is a ROM of the hierarchical bitline type in the second example. In this second example, a bank select transistor BT2A2 electrically connect the sub-bitline SB3A to the contact hole C11 in the same manner as the bank select transistor BT2A of the first example. However, the configuration of the bank select transistor BT2A2 of the second example is different that of the bank select transistor BT2A of the first example. It is noted that the same components of the ROM 102 shown in FIGS. 3 and 4 as those shown in FIGS. 1 and 2 are identified by the same reference numerals and the description thereof will be omitted in principle.

Next, the configuration of the bank select transistor BT2A2 will be described in detail below with reference to FIG. 4.

The bank select transistor BT2A2 includes: a source or drain electrode EL1; a drain or source electrode EL2; and a gate electrode EL3. A part of the auxiliary conductive region BB11 is used as the electrode EL1, a part of the sub-bitline SB3A is used as the electrode EL2 and a part of the bank select line BS2A is used as the gate electrode EL3. More specifically, the part of the auxiliary conductive region BB11 which is covered or overlapped with the bank select line BS2A is used as the electrode EL1 and the part of the sub-bitline SB3A which is covered or overlapped with the bank select line BS2A is used as the electrode EL2. The width of the electrode EL2 or the channel width is larger than that of the remaining part of the sub-bitline SB3A other than the part in which the electrode EL2 is formed.

In this second example utilizing such a configuration, the gate width of the bank select transistor BT2A can be enlarged to be equal to the width of the auxiliary conductive region BB11 along the longitudinal direction of the word lines without considerably increasing the area of the bank region. As a result, a larger amount of current can flow through the bitlines.

EXAMPLE 3

Hereinafter, the architecture of a semiconductor memory device in the third example of the present invention will be described with reference to FIGS. 5 and 6.

Figure 5:
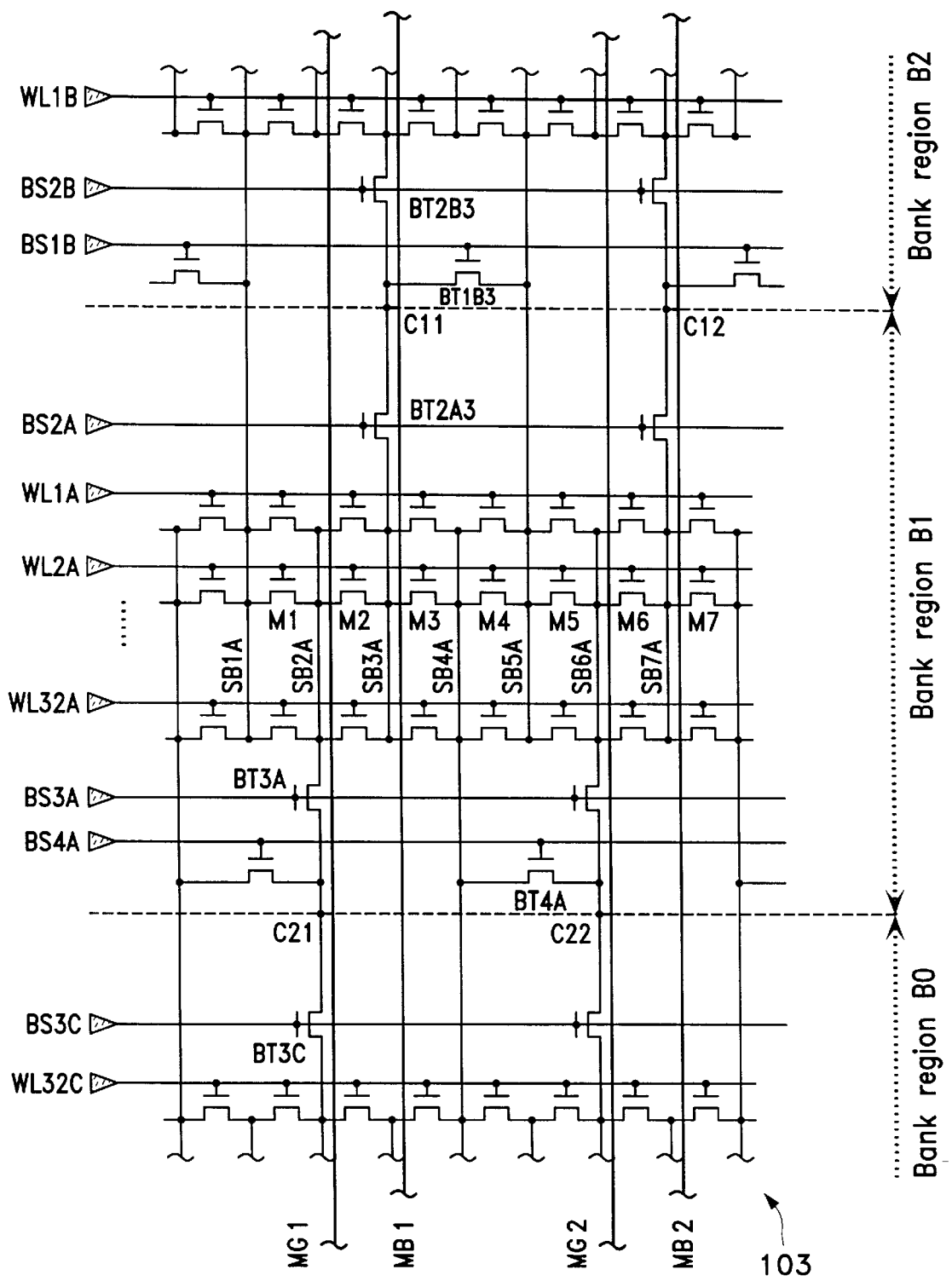
FIG. 5 is an equivalent circuit diagram of a semiconductor memory device in the third example of the present invention.

FIG. 5 is an equivalent circuit diagram of the semiconductor memory device in the third example of the present invention. FIG. 6 is a diagram showing an exemplary layout pattern of the respective layers included in the semiconductor memory device.

Figure 6:
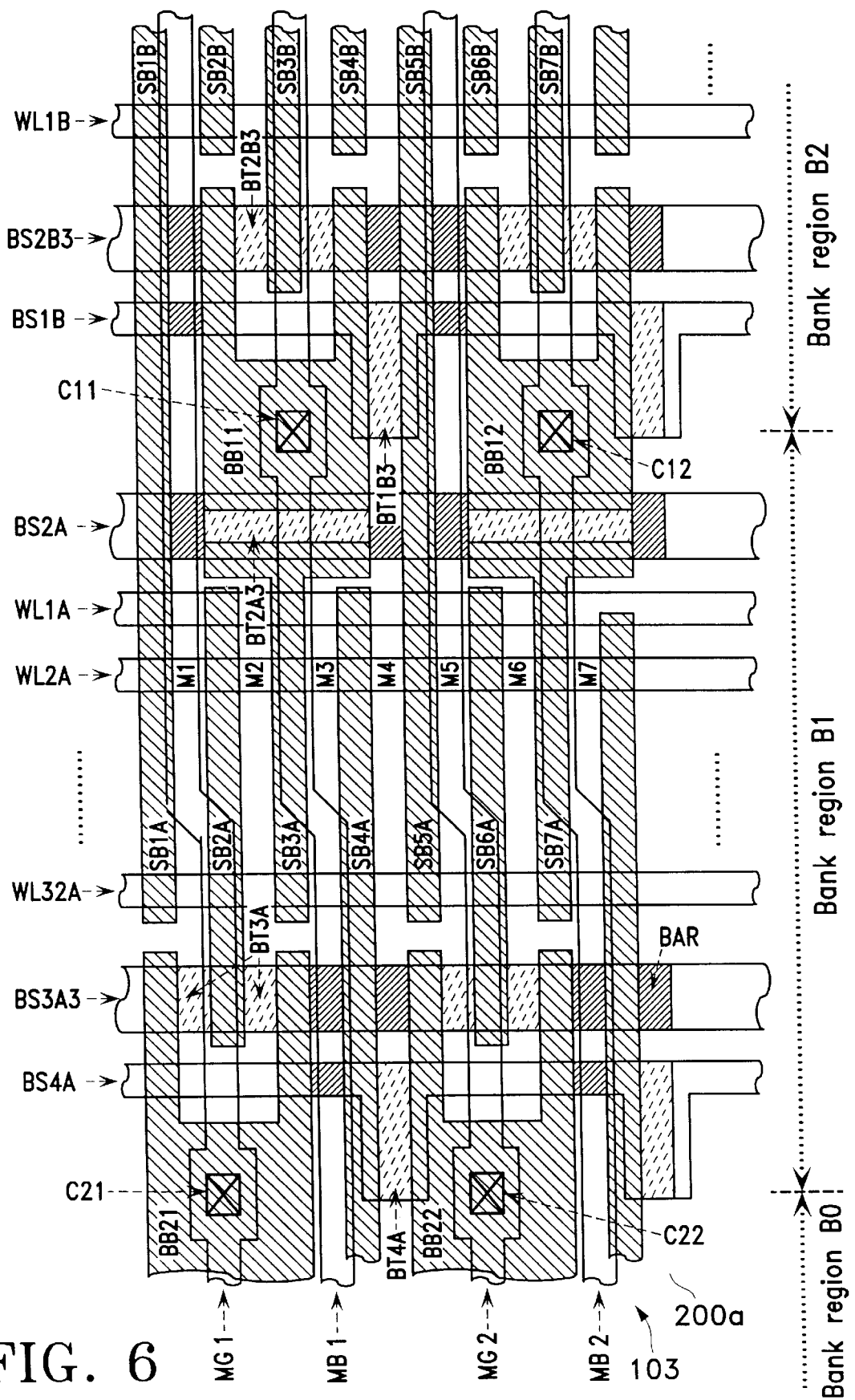
FIG. 6 is a diagram showing an exemplary layout pattern of the respective layers included in the semiconductor memory device.

In FIGS. 5 and 6, a ROM 103 is a ROM of the hierarchical bitline type in the third example.

The configuration of a bank select transistor BT2A3 of the third example is substantially the same as that of the bank select transistor BT2A2 of the second example. In the third example, the effective channel widths of the bank select transistors connected to the auxiliary conductive region BB11 are equal to each other. More specifically, the width of a bank select line BS2B3 is adjusted such that the effective channel width of a bank select transistor BT2B3 becomes equal to the effective channel width of the other bank select transistors BT1B3 and BT2A3 connected to the auxiliary conductive region BB11. It is noted that the width of a bank select line BS3A3 may be set in the same way as the width of the bank select line BS2B3.

In the third example utilizing such a configuration, the amount of bitline current can be equalized irrespective of the selected bank select transistor so that a margin for a read time can be increased.

It is noted that the same components of the ROM 103 shown in FIGS. 5 and 6 as those shown in FIGS. 3 and 4 are identified by the same reference numerals and the description thereof has been omitted in principle.

EXAMPLE 4

Hereinafter, the architecture of a semiconductor memory device in the fourth example of the present invention will be described with reference to FIGS. 7 and 8.

Figure 7:
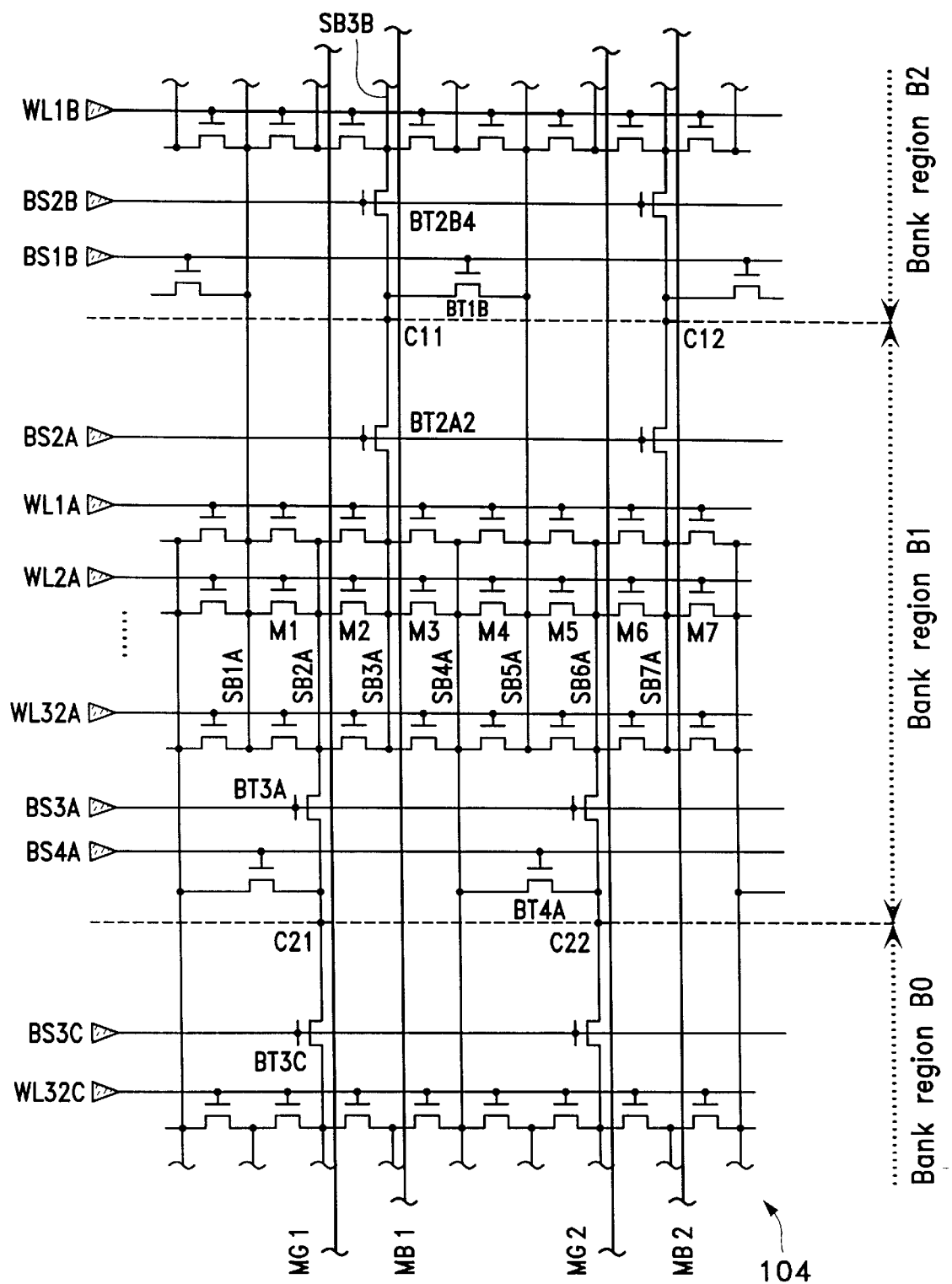
FIG. 7 is an equivalent circuit diagram of a semiconductor memory device in the fourth example of the present invention.

FIG. 7 is an equivalent circuit diagram of the semiconductor memory device in the fourth example of the present invention. FIG. 8 is a diagram showing an exemplary layout pattern of the respective layers included in the semiconductor memory device.

Figure 8:
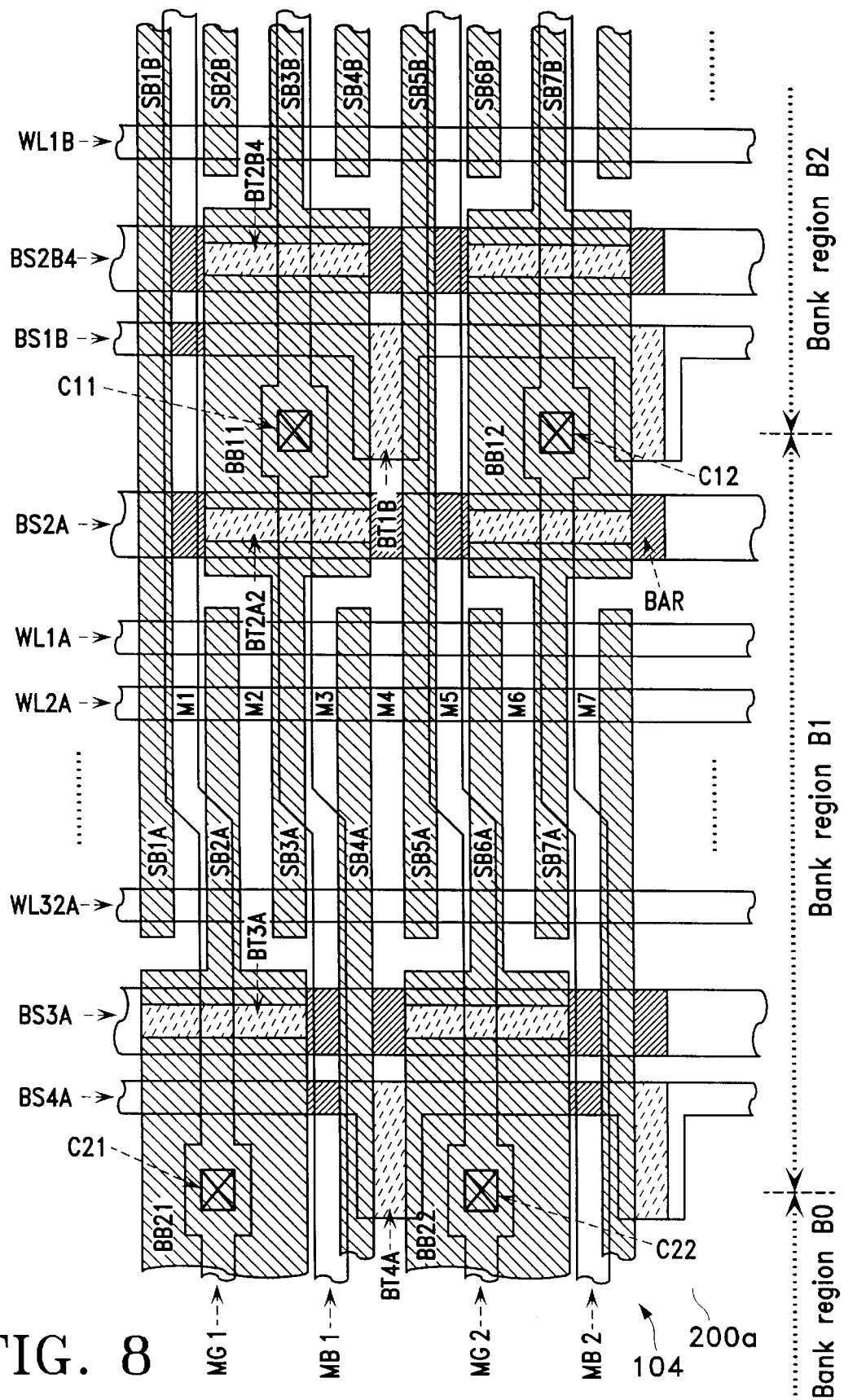
FIG. 8 is a diagram showing an exemplary layout pattern of the respective layers included in the semiconductor memory device.

In FIGS. 7 and 8, a ROM 104 is a ROM of the hierarchical bitline type in the fourth example.

In the same way as the bank select transistor BT2B of the second example, a bank select transistor BT2B4 of the fourth example electrically connect the sub-bitline SB3B to the contact hole C11 depending upon the potential on the select line BS2B. The configuration of the bank select transistor BT2B4 of the fourth example is substantially the same as that of the bank select transistor BT2A2 of the second example. It is noted that the same components of the ROM 104 shown in FIGS. 7 and 8 as those shown in FIGS. 3 and 4 are identified by the same reference numerals and the description thereof will be omitted in principle.

In the fourth example, a bank select transistor BT2B4 for selecting the second bank region B2 is opposed to the bank select transistor BT2A2 for selecting the first bank region B1 via the contact hole C11 therebetween. The channel width of the bank select transistor BT2A2 is preferably equal to that of the bank select transistor BT2B4. In such a case, the amount of bitline current can be equalized irrespective of the selected bank select transistor so that a margin for a read time can be increased.

EXAMPLE 5

Hereinafter, the architecture of a semiconductor memory device in the fifth example of the present invention will be described with reference to FIGS. 9 and 10.

Figure 9:
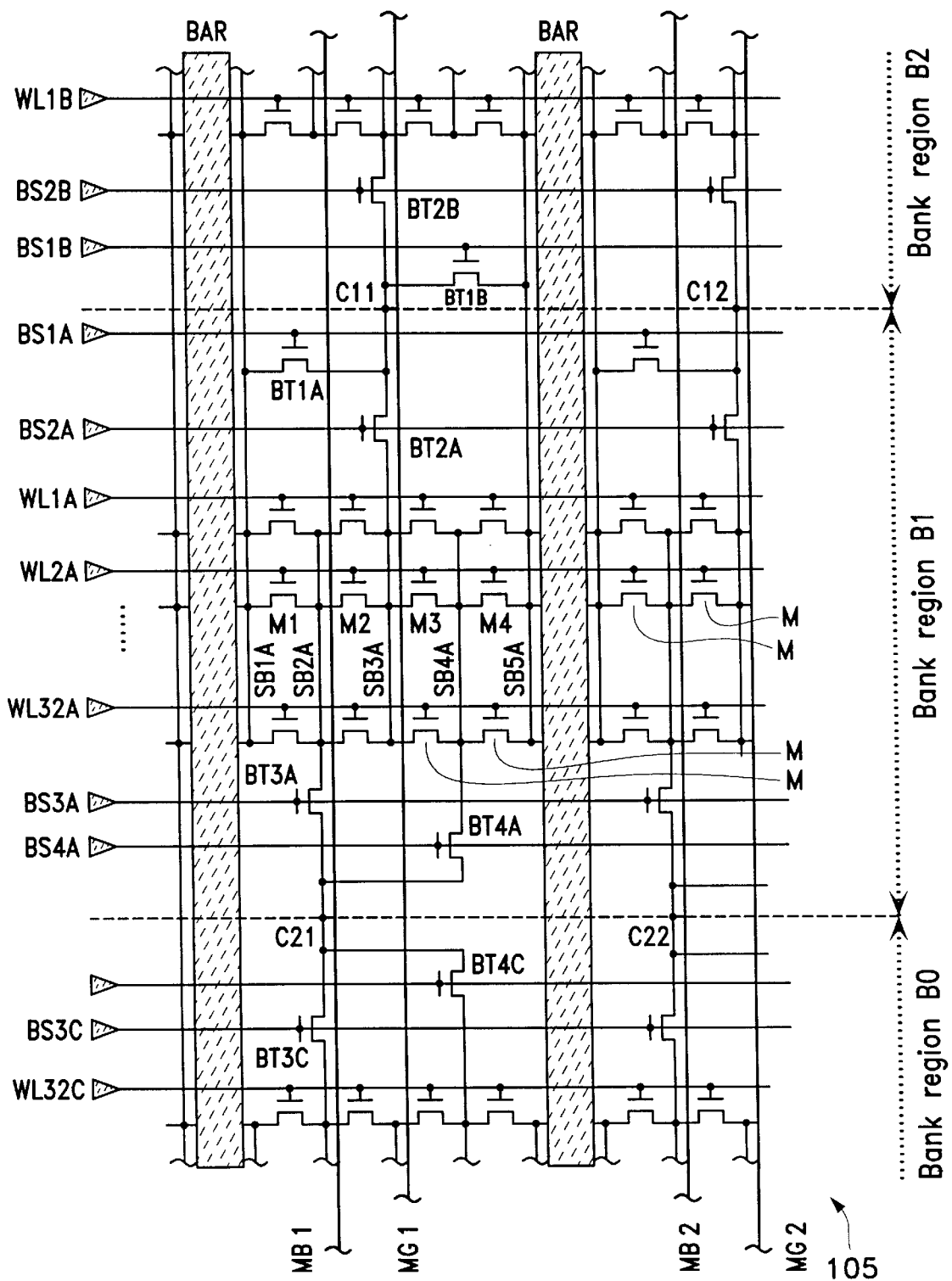
FIG. 9 is an equivalent circuit diagram of a semiconductor memory device in the fifth example of the present invention.

FIG. 9 is an equivalent circuit diagram of the semiconductor memory device in the fifth example of the present invention. FIG. 10 is a diagram showing an exemplary layout pattern of the respective layers included in the semiconductor memory device.

Figure 10:
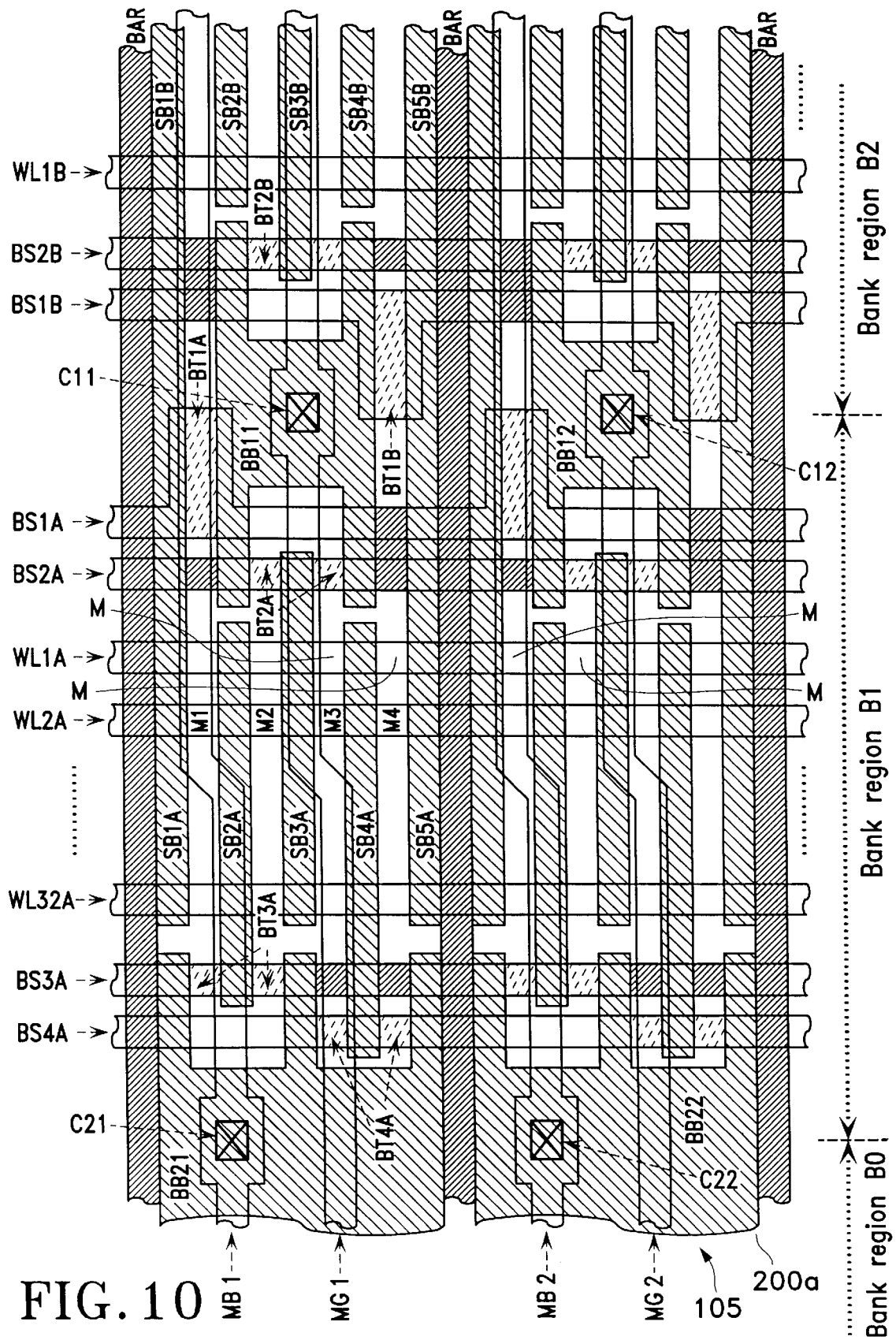
FIG. 10 is a diagram showing an exemplary layout pattern of the respective layers included in the semiconductor memory device.

In FIGS. 9 and 10, a ROM 105 is a ROM of the hierarchical bitline type in the fifth example and includes a P-type semiconductor substrate 200a. The predetermined surface area of the semiconductor substrate 200a is divided into a plurality of blocks. A plurality of bank regions B0, B1, B2, etc. are provided thereon so as to correspond to the respective blocks. In this arrangement, a set of five sub-bitlines SB1A through SB5A are collectively disposed as one unit. The regions for placing thereon two adjacent units, each including a set of five sub-bitlines, are electrically isolated from each other via an isolation region BAR subjected to such processing as ion implantation for programming the ROM.

For example, a first bank region B1 includes: a plurality of sub-bitlines SB1A to SB5A made of $N^+$-type diffusion layers and formed on the P-type semiconductor substrate 200a; a plurality of word lines WL1A, WL2A, ... WL32A made of poly-silicon layers and hardwired so as to cross the respective bitlines; and a plurality of memory cells M1 to M4, each of which is provided between adjacent ones of the sub-bitlines and uses the associated word line as the gate electrode thereof.

The first bank region B1 further includes: a pair of auxiliary conductive regions BB11 and BB12 which are provided on the one terminal side of the sub-bitlines and have the same conductivity type as that of the sub-bitlines; another pair of auxiliary conductive regions BB21 and BB22 which are provided on the other terminal side of the sub-bitlines and have the same conductivity type as that of the sub-bitlines; a bank select transistor BT2A formed between a part of the sub-bitline SB3A and parts of the auxiliary conductive region BB11; a bank select transistor BT1A formed between a part of the sub-bitline SB1A and a part of the auxiliary conductive region BB11; a bank select transistor BT1B formed between a part of the sub-bitline SB5A and a part of the auxiliary conductive region BB11; and a bank select transistor BT3A formed between a part of the sub-bitline SB2A and parts of the auxiliary conductive region BB21. The first bank region B1 further includes: a bank select transistor BT4A formed between parts of the sub-bitline SB4A and parts of the auxiliary conductive region BB21; and the bank select lines BS1A to BS4A and BS1B functioning as the gate electrodes of the respective bank select transistors.

The auxiliary conductive regions BB11 and BB12 are connected to the main ground lines MG1 and MG2, implemented as metal wires, via the contact holes C11 and C12, respectively, while the auxiliary conductive regions BB21 and BB22 are connected to the main bitlines MB1 and MB2, implemented as metal wires, via the contact holes C21 and C22, respectively.

Similarly, the second bank region B2 includes: a plurality of sub-bitlines SB1B to SB5B made of N⁺-type diffusion layers and formed on the semiconductor substrate 200a; a plurality of word lines WL1B, etc. made of poly-silicon and hardwired so as to cross the respective bitlines; and a plurality of memory cells M, each of which is provided between adjacent ones of the sub-bitlines and uses the associated word line as the gate electrode thereof.

In addition, the second bank region B2 shares the pair of auxiliary conductive regions BB11 and BB12, which are provided on the other terminal side of the sub-bitlines SB1B to SB5B and have the same conductivity type as that of the sub-bitlines, with the first bank region B1. In the second bank region B2, a bank select transistor BT2B is formed between the other terminal of the sub-bitline SB3B and parts of the auxiliary conductive region BB11, while a bank select transistor BT1B is formed between the one terminal of the sub-bitline SB5B and parts of the auxiliary conductive region BB11. In addition, a bank select transistor BT1A is formed between the other terminal of the sub-bitline SB1B and a part of the auxiliary conductive region BB11.

Next, an exemplary operation of the semiconductor memory device of the fifth example will be briefly described.

For example, when the information stored in a memory cell M4 is read, the word line WL2A and the bank select lines BS1B and BS4A are set high, thereby activating the bank select transistors BT1B and BT4A. The sub-bitline SB5A connected to the one (source or drain) terminal of the memory cell M4 is electrically connected to the main bitline MB1 via the contact hole C11, while the sub-bitline SB4A connected to the other (drain or source) terminal of the memory cell M4 is electrically connected to the main ground line MG2 via the contact hole C22. As a result, the data stored in the memory cell M4 can be read out.

Next, a more detailed configuration of the semiconductor memory device of the fifth example will be described.

As described above, the first bank region B1 shares the auxiliary conductive regions BB11 and BB12 with the second bank region B2 adjacent thereto. In addition, one of the sub-bitlines SB1A and SB5A of the first bank region B1 which are connected to the auxiliary conductive region BB11 is extended and connected to the counterpart of the sub-bitlines SB1B and SB5B of the second bank region B2 adjacent to the first bank region B1.

The bank select transistor BT1A is formed between a part of the associated pair of sub-bitlines SB1A & SB1B and a part of the auxiliary conductive region BB11. A part of the bank select line BS1A functioning as the gate electrode of the bank select transistor BT1A is hardwired in parallel to the word lines. On the other hand, the bank select transistor BT1B is formed between a part of the associated pair of sub-bitlines SB5A & SB5B and a part of the auxiliary conductive region BB11. A part of the bank select line BS1B functioning as the gate electrode of the bank select transistor BT1B is also hard-wired in parallel to the word lines.

In this manner, since the two adjacent bank regions B1 and B2 can share the bank select transistors BT1A and BT1B, the number of bank select transistors and bank select lines can be reduced.

Since these bank select transistors BT1A and BT1B assume the gate width direction thereof to be parallel to the longitudinal direction of the sub-bitlines and the gate regions thereof can be provided on the sides of the auxiliary conductive region BB11 having the contact hole C11, the gate width can be increased without increasing the area of the bank region. As a result, a larger amount of current can flow through the bitlines.

Furthermore, since a set of predetermined number of sub-bitlines is electrically isolated from an adjacent set of sub-bitlines via an isolation region BAR, leak current does not flow through the regions isolated by the isolation region BAR. Thus, in this fifth example, an erroneous activation of a ROM owing to leak current is less likely to be caused.

EXAMPLE 6

Hereinafter, the architecture of a semiconductor memory device in the sixth example of the present invention will be described with reference to FIGS. 11 to 14.

Figure 11:
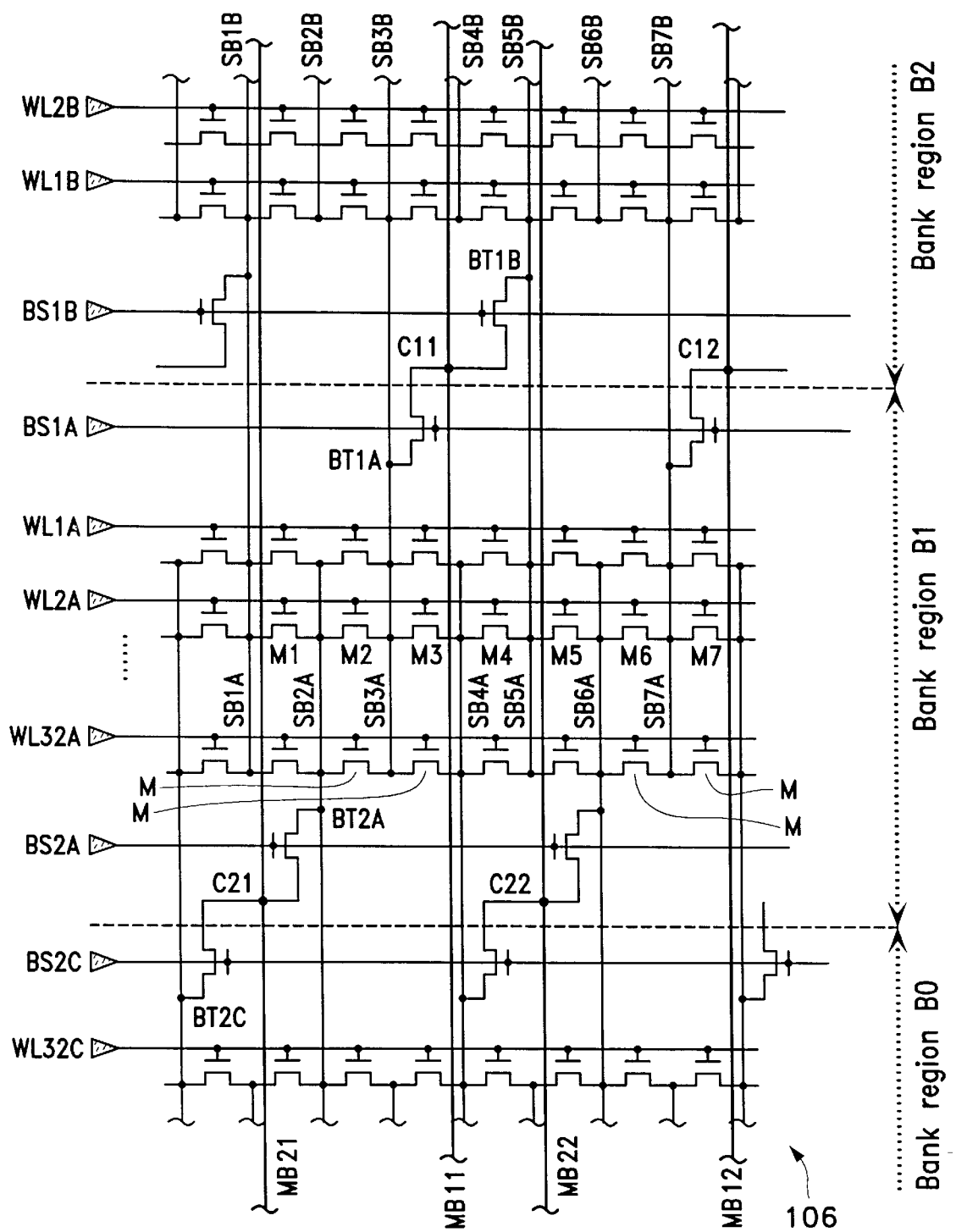
FIG. 11 is an equivalent circuit diagram of a semiconductor memory device in the sixth example of the present invention.
Figure 12:
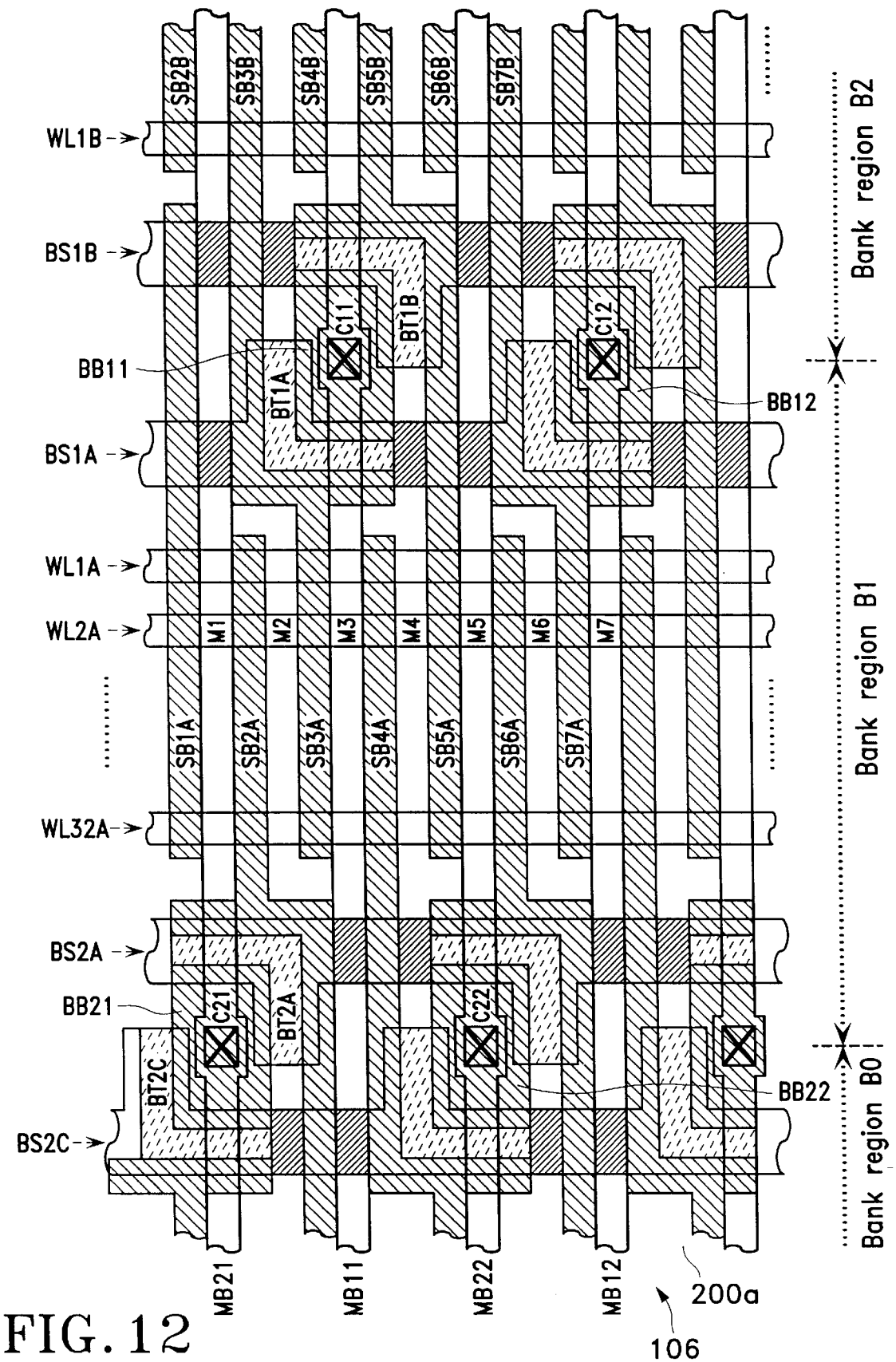
FIG. 12 is a diagram showing an exemplary layout pattern for the respective layers included in the semiconductor memory device of the sixth example.
Figure 13:
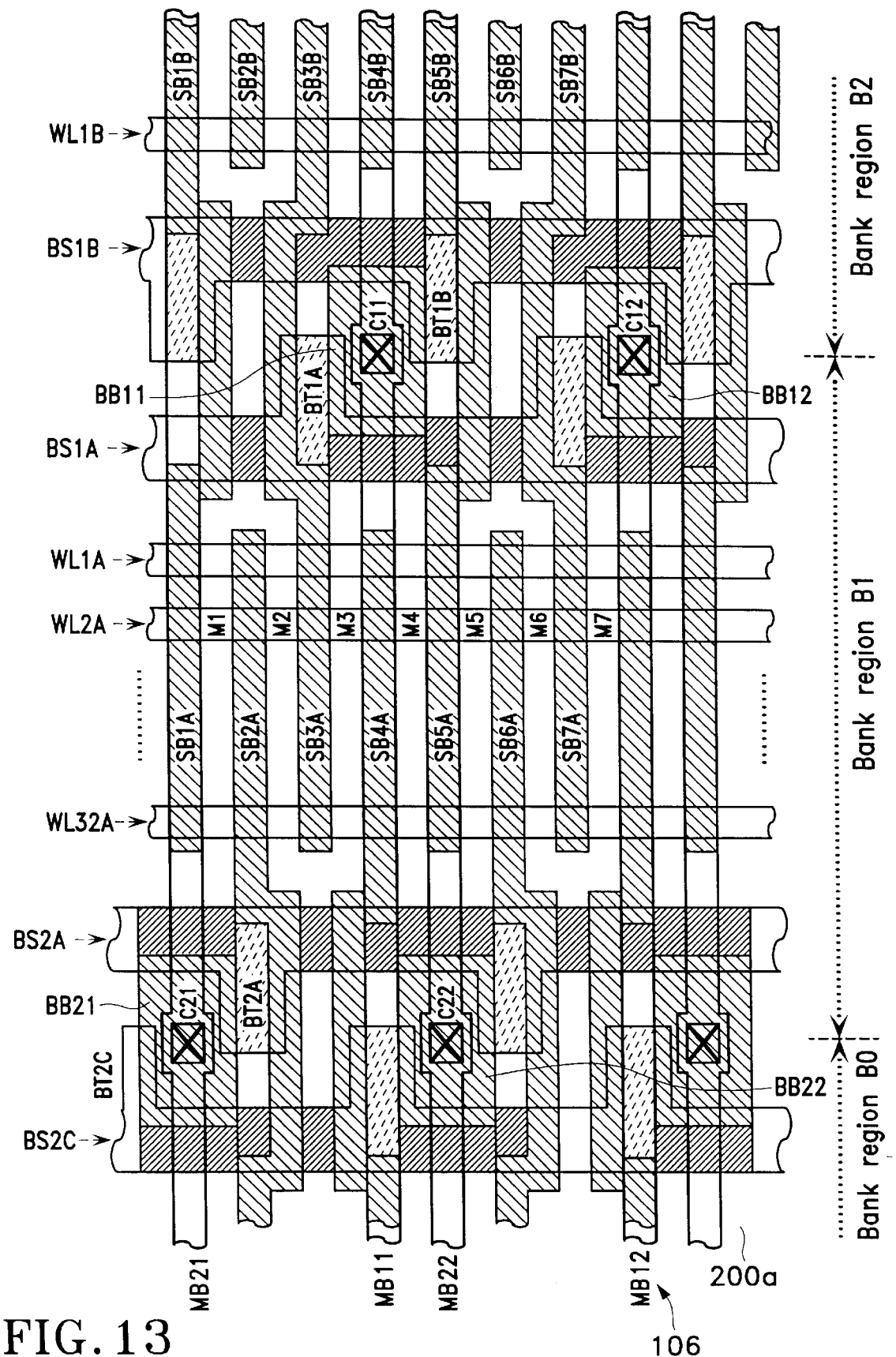
FIG. 13 is a diagram showing another exemplary layout pattern for the respective layers included in the semiconductor memory device of the sixth example.
Figure 14:
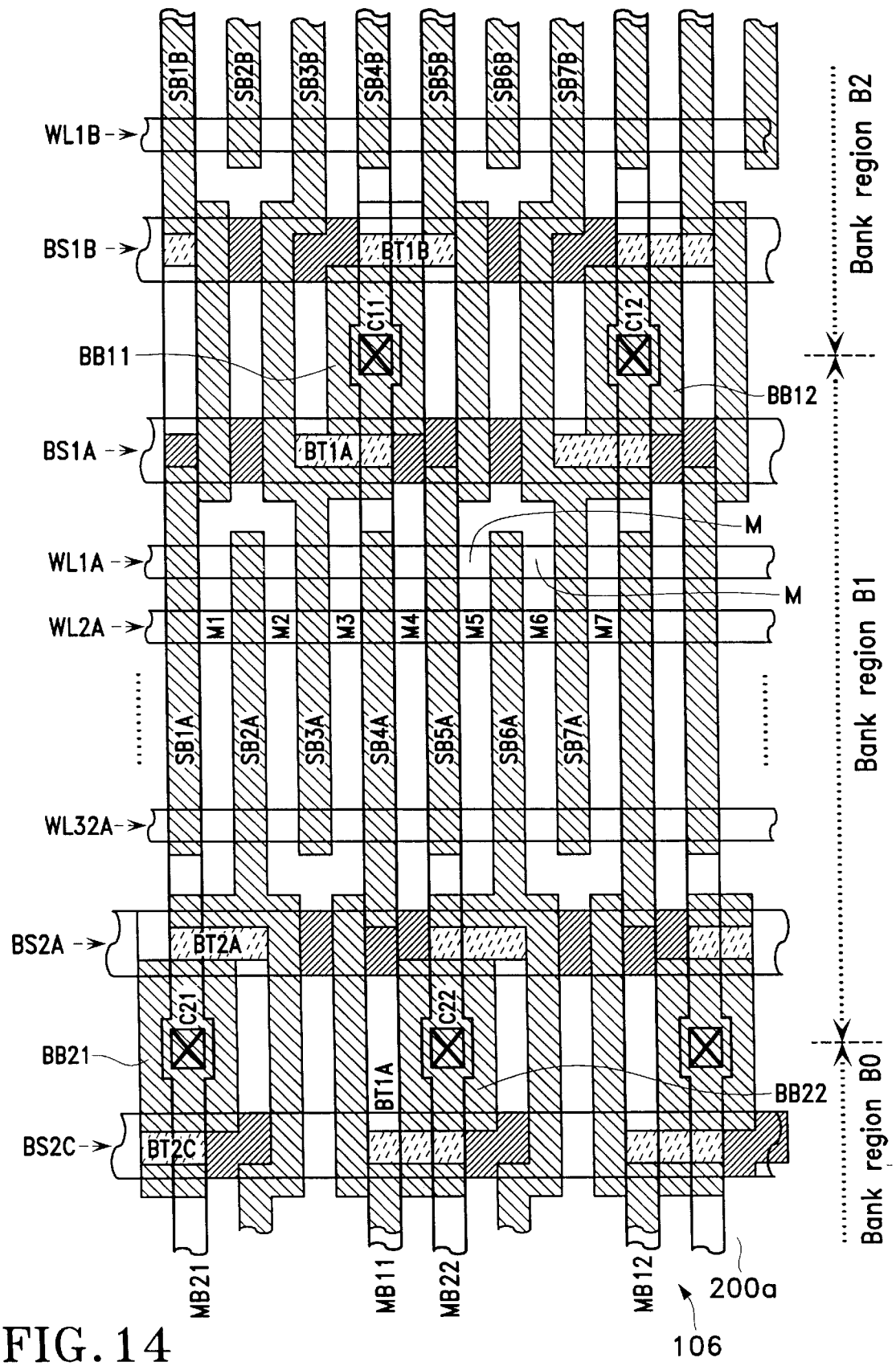
FIG. 14 is a diagram showing still another exemplary layout pattern for the respective layers included in the semiconductor memory device of the sixth example.

FIG. 11 is an equivalent circuit diagram of the semiconductor memory device in the sixth example of the present invention. FIGS. 12 to 14 are diagrams showing exemplary layout patterns of the respective layers included in the semiconductor memory device.

In FIGS. 11 to 14, a ROM 106 is a ROM of a hierarchical bitline type of the sixth example and includes a P-type semiconductor substrate 200a. The predetermined surface area of the semiconductor substrate 200a is divided into a plurality of blocks. A plurality of bank regions B0, B1, B2, etc. are provided thereon so as to correspond to the respective blocks. For example, a first bank region B1 includes: a plurality of sub-bitlines SB1A to SB7A made of N⁺-type diffusion layers and formed on the P-type semiconductor substrate 200a; a plurality of word lines WL1A, WL2A, ... . WL32A made of poly-silicon layers and hard-wired so as to cross the respective bitlines; and a plurality of memory cells M1 to M7 and M, each of which is provided between adjacent ones of the sub-bitlines and uses the associated word line as the gate electrode thereof.

The first bank region B1 includes: a pair of auxiliary conductive regions BB11 and BB12 which are provided on the one terminal side of the sub-bitlines SB1A to SB7A and have the same conductivity type as that of the sub-bitlines; another pair of auxiliary conductive regions BB21 and BB22 which are provided on the other terminal side of the sub-bitlines SB1A to SB7A and have the same conductivity type as that of the sub-bitlines; a plurality of bank select transistors BT1A, BT1B, BT2A and BT2C, each of which is formed between an auxiliary conductive region and a sub-bitline; and a plurality of bank select lines BS1A, BS1B and BS2A made of poly-silicon and functioning as the gate electrodes of these bank select transistors.

These auxiliary conductive regions are connected to the main bitlines MB11, MB12, MB21 and MB22 implemented as metal wires via the contact holes C11, C12, C21 and C22, respectively.

The second bank region B2 shares the pair of auxiliary conductive regions BB11 and BB12, which are provided on the one terminal side of the sub-bitlines SB1B to SB7B and have the same conductivity type as that of the sub-bitlines, with the first bank region B1. In this example, a bank select transistor BT1A is formed between a part of the other terminal of the sub-bitline SB3B and a part of the auxiliary conductive region BB11, while a bank select transistor BT1B is formed between the other terminal of the sub-bitline SB5B and the auxiliary conductive region BB11.

The bank select lines BS1B and BS1A disposed in parallel to the word lines function as the gates of the bank select transistors BT1B and BT1A, respectively.

In the same manner as the first and the second bank regions B1 and B2, the bank region B0 adjacent to the first bank region B1 also includes a plurality of sub-bitlines, a plurality of word lines and a plurality of bank select lines and shares the auxiliary conductive regions BB21 and BB22 with the first bank region B1.

Next, the characteristic features of the semiconductor memory device of the sixth example will be described.

As described above, the first bank region B1 shares the auxiliary conductive regions BB11 and BB12 with the second bank region B2 adjacent thereto. The sub-bitlines SB3A and SB5A among the sub-bitlines SB1A to SB7A of the first bank region B1 are respectively connected to the associated sub-bitlines SB3B and SB5B among the sub-bitlines SB1B to SB7B of the second bank region B2, thereby forming sub-bitline pairs. These sub-bitline pairs are connected to the auxiliary conductive region BB11 via the bank select transistors BT1A and BT1B, respectively.

A part of the bank select lines BS1A and BS1B functioning as the gates electrodes of the bank select transistors BT1A and BT1B are hard-wired in parallel to the word lines via the contact holes C11 and C12 therebetween. Similarly, two sub-bitline pairs are connected to the auxiliary conductive region BB21 via the bank select transistors BT2A and BT2C. The sub-bitline pairs connected to the auxiliary conductive regions BB21 and BB22 shared between the bank regions B0 and B1 are alternately hard-wired with the sub-bitline pairs connected to the auxiliary conductive regions BB11 and BB12 shared between the bank regions B1 and B2.

In the sixth example utilizing such an arrangement, only two bank select lines are required for a single bank region. Thus, the area of the array of ROM cells of a hierarchical bitline type can be reduced.

Also, in this example, two bank select lines and thirty-two word lines are provided for a single bank region. Thus, as compared with a conventional arrangement, the area of a memory cell array can be reduced to about $17/18$ (=(32+2)/(32+4)).

For example, when the information stored in a memory cell M2 is read, the word line WL2A and the bank select lines BS1A and BS2A are set high, thereby activating the bank select transistors BT1A and BT2A. Thus, the sub-bitlines SB3A and SB2A are connected to the main bitlines MB11 and MB21 via the contact holes C11 and C21, respectively. In this case, the memory cell M6 is also selected. However, since the main bitlines MB11 and MB12 are connected to the data lines via column select transistors and the main bitlines MB21 and MB22 are grounded via column select transistors, only the information stored in the memory cell M2 can be read owing to the existence of the column select transistors. It is noted that the main bitlines MB11 and MB12 correspond to the main bitlines MB1 and MB2 of the first to the fifth examples and the main bitlines MB21 and MB22 correspond to the main ground lines MG1 and MG2 of the first to the fifth examples.

All of the layout patterns depicted in FIGS. 12 to 14 correspond to the circuit diagram depicted in FIG. 11 and implement ROMs having the same capability. In other words, the layout pattern employed in this sixth example can be modified in various ways, as shown in FIGS. 12 to 14, depending upon the design-rule restrictions for an LSI and the drivability of the bank select transistors. Hereinafter, the main difference among the layout patterns of FIGS. 12 to 14 will be described.

The layout patterns shown in FIGS. 12 to 14 differ from each other mainly with respect to the configurations of the bank select transistors BT1A and BT1B.

Specifically, in the layout pattern shown in FIG. 12, the gate region of each of the bank select transistors BT1A and BT1B is formed so as to cover two adjacent sides of the rectangular auxiliary conductive region BB11, for example.

On the other hand, in the layout pattern shown in FIG. 13, the gate regions of the bank select transistors BT1A and BT1B are disposed along the sides of the rectangular auxiliary conductive region BB11 which are parallel to the longitudinal direction of the sub-bitlines.

Furthermore, in the layout pattern shown in FIG. 14, the gate regions of the bank select transistors BT1A and BT1B are disposed along the sides of the rectangular auxiliary conductive region BBL1 which are vertical to the longitudinal direction of the sub-bitlines.

Thus, in a ROM using the layout pattern shown in FIG. 12, the channel width of the bank select transistors is longer as compared with ROMs using the layout patterns shown in FIGS. 13 and 14. Thus, a ROM using the layout pattern shown in FIG. 12 has a higher drivability.

Moreover, in this sixth example, a pair of auxiliary conductive regions to be connected to the sub-bitline pairs are disposed on both sides of a single bank region and a pair of bank select lines to be connected to the same auxiliary conductive region respectively belong to two adjacent bank regions. By arranging the auxiliary conductive regions and the bank select lines in this manner, the layout pattern of a memory cell array can be designed such that the area of the array is utilized more efficiently and the variation in resistances of the sub-bitlines depending upon the location within a memory cell bank is reduced.

EXAMPLE 7

Hereinafter, the architecture of a semiconductor memory device in the seventh example of the present invention will be described with reference to FIGS. 15 and 16.

Figure 15:
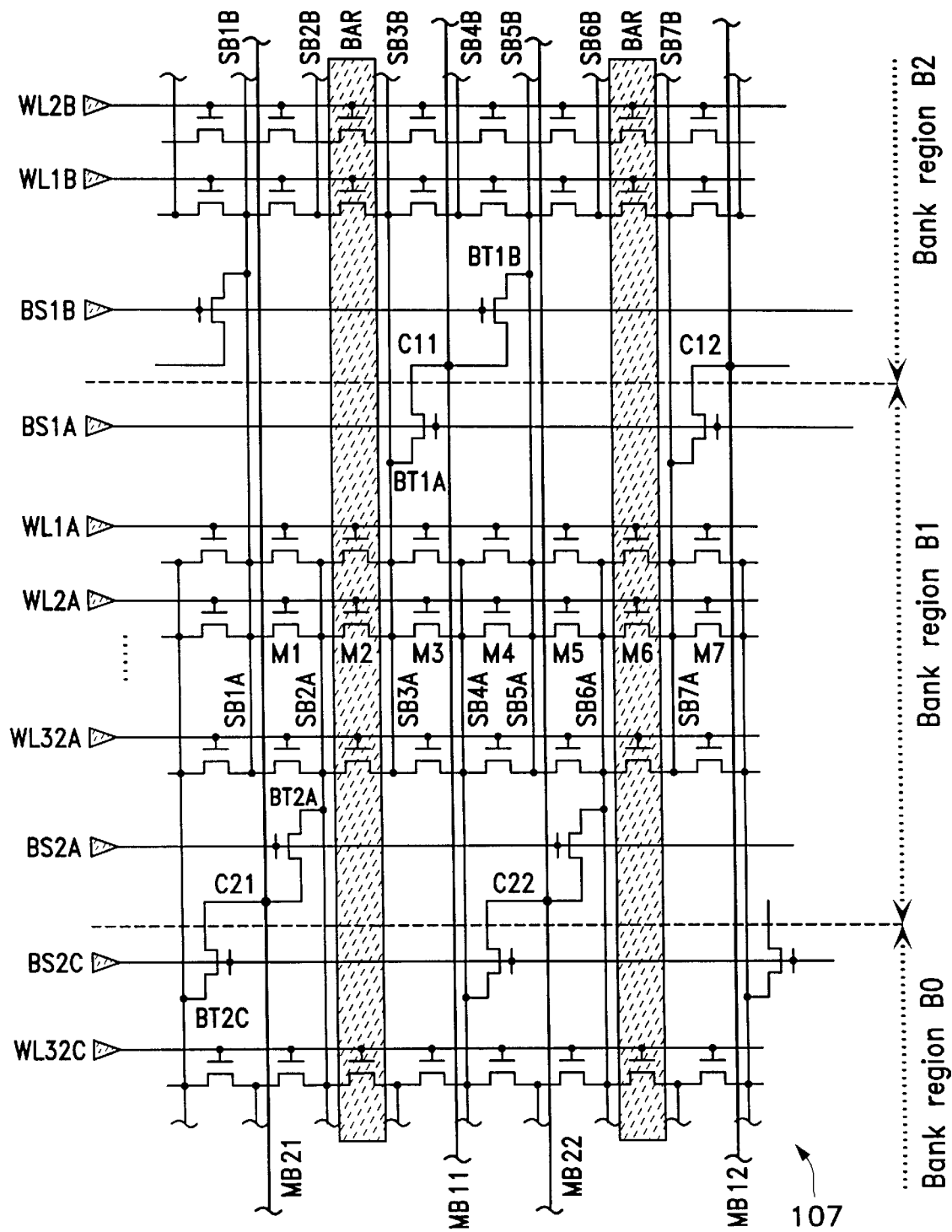
FIG. 15 is an equivalent circuit diagram of a semiconductor memory device in the seventh example of the present invention.
Figure 16:
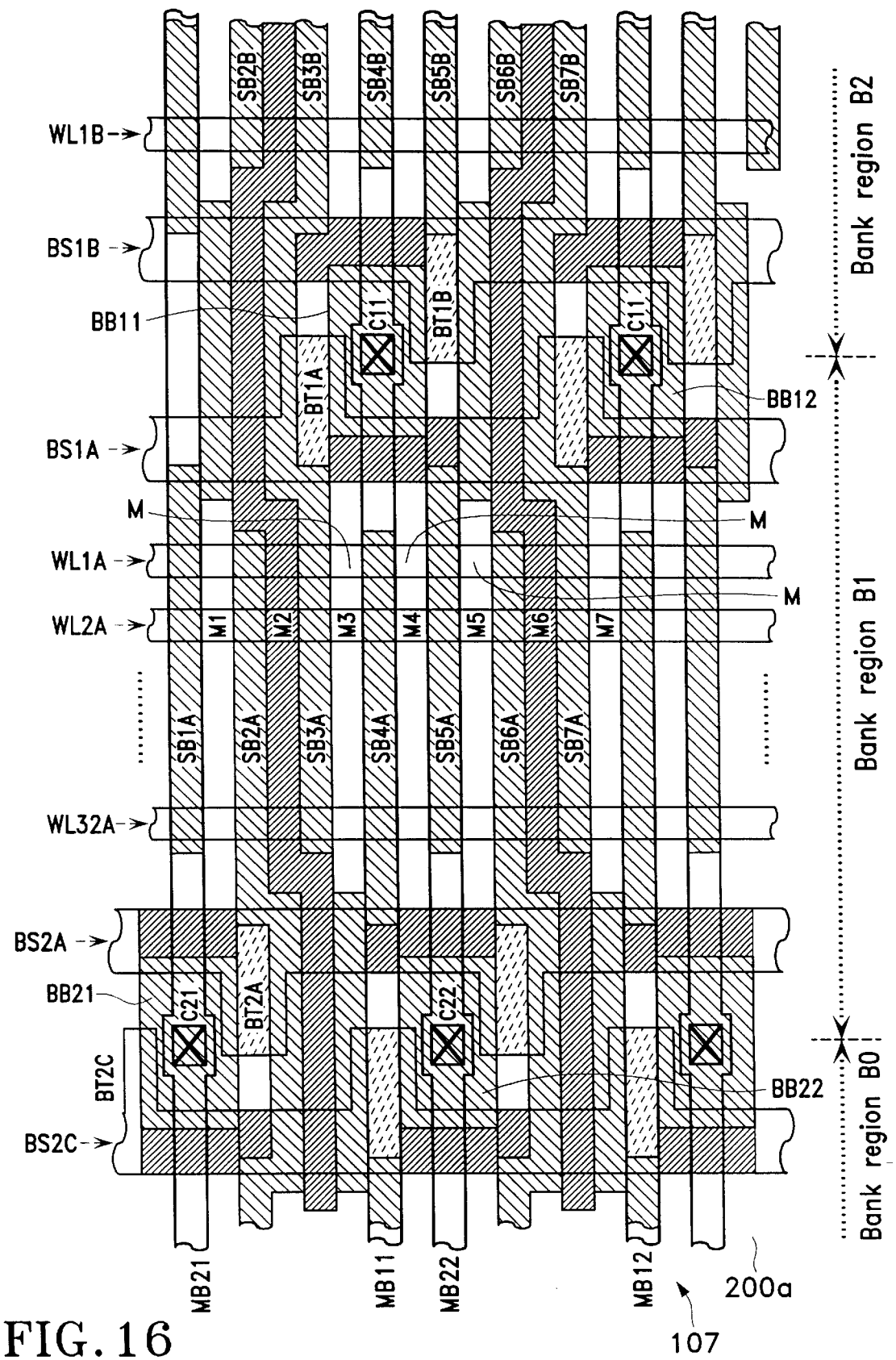
FIG. 16 is a diagram showing an exemplary layout pattern for the respective layers included in the semiconductor memory device in the seventh example of the present invention.

FIG. 15 is an equivalent circuit diagram of the semiconductor memory device in the seventh example of the present invention. FIG. 16 is a diagram showing an exemplary layout pattern of the respective layers included in the semiconductor memory device.

In this example, in addition to the above-described configuration of the ROM in which the first and the second bank regions B1 and B2 share the auxiliary conductive regions BB11 and BB12, electrical isolation bands BAR are provided between a sub-bitline SB2A and a sub-bitline SB3A, between a sub-bitline SB2B and a sub-bitline SB3B, between a sub-bitline SB6A and a sub-bitline SB7A and between a sub-bitline SB6B and a sub-bitline SB7B. It is noted that memory cells can be formed in the regions of the isolation bands BAR, and the memory cells become "OFF cells".

Such an isolation band BAR can be formed by selectively implanting ions into the region between specified sub-bitlines by performing ion implantation processing or the like for programming a ROM.

In the ROM 107 of the seventh example utilizing such a configuration, not only the effects of the sixth example but also the following effects are attained.

In the case of selecting a memory cell M3, the bank select lines BS1A and BS2C and the word line WL2A are set high. In this case, another memory cell M7 is selected simultaneously with the desired memory cell M3. In the configuration of the sixth example, when the memory cells M4 to M6 are ON cells, then leak current is generated between the selected sub-bitlines SB4A and SB7A and the bitline potential is adversely varied. However, in the configuration of the seventh example, an isolation band BAR is provided between the sub-bitlines SB6A and SB7A. Consequently, such leak current can be eliminated and a read-out margin can be improved.

EXAMPLE 8

Hereinafter, the architecture of a semiconductor memory device in the eighth example of the present invention will be described with reference to FIGS. 17 and 18.

Figure 17:
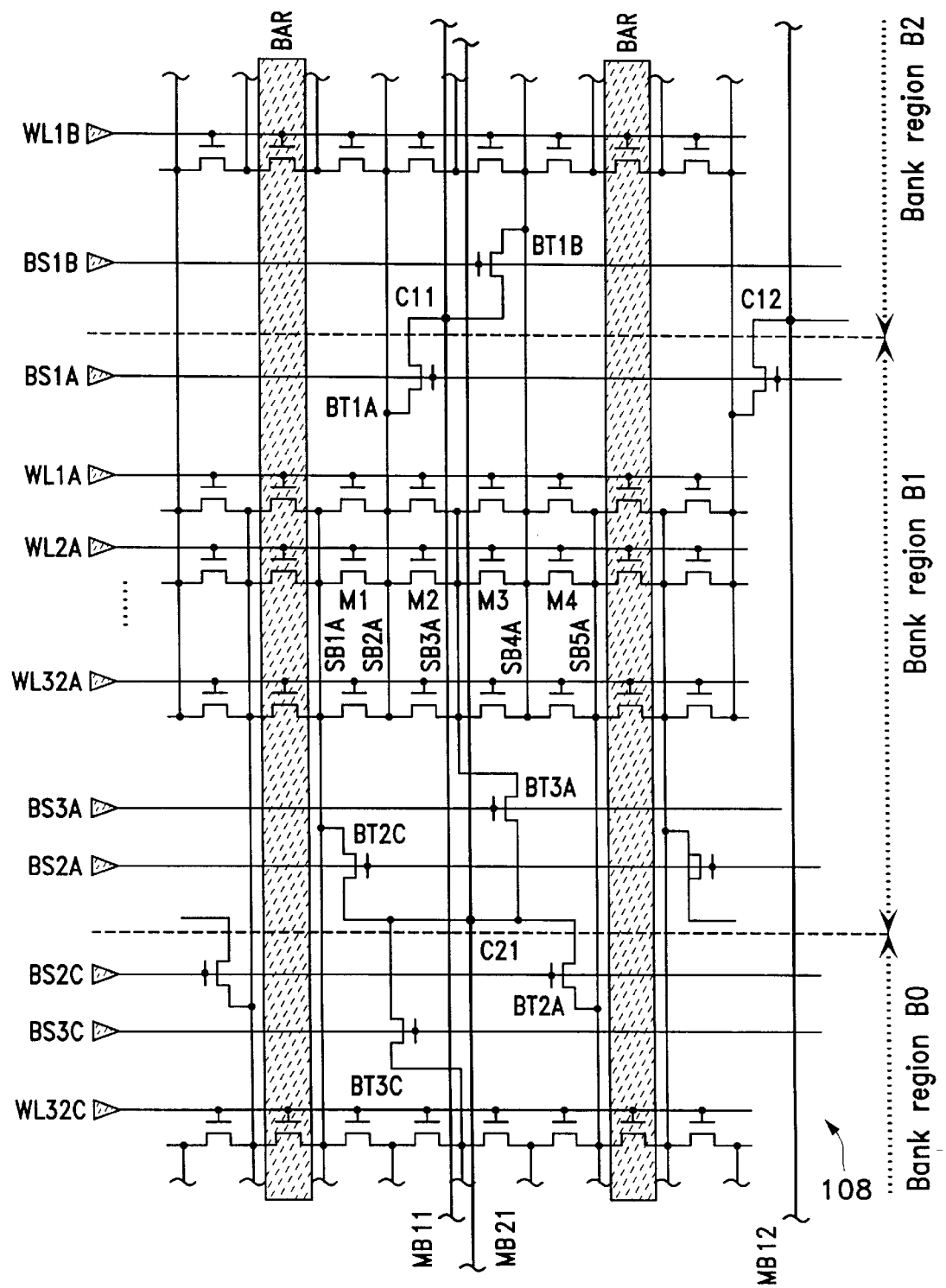
FIG. 17 is an equivalent circuit diagram of a semiconductor memory device in the eighth example of the present invention.

FIG. 17 is an equivalent circuit diagram of the semiconductor memory device in the eighth example of the present invention. FIG. 18 is a diagram showing an exemplary layout pattern of the respective layers included in the semiconductor memory device.

Figure 18:
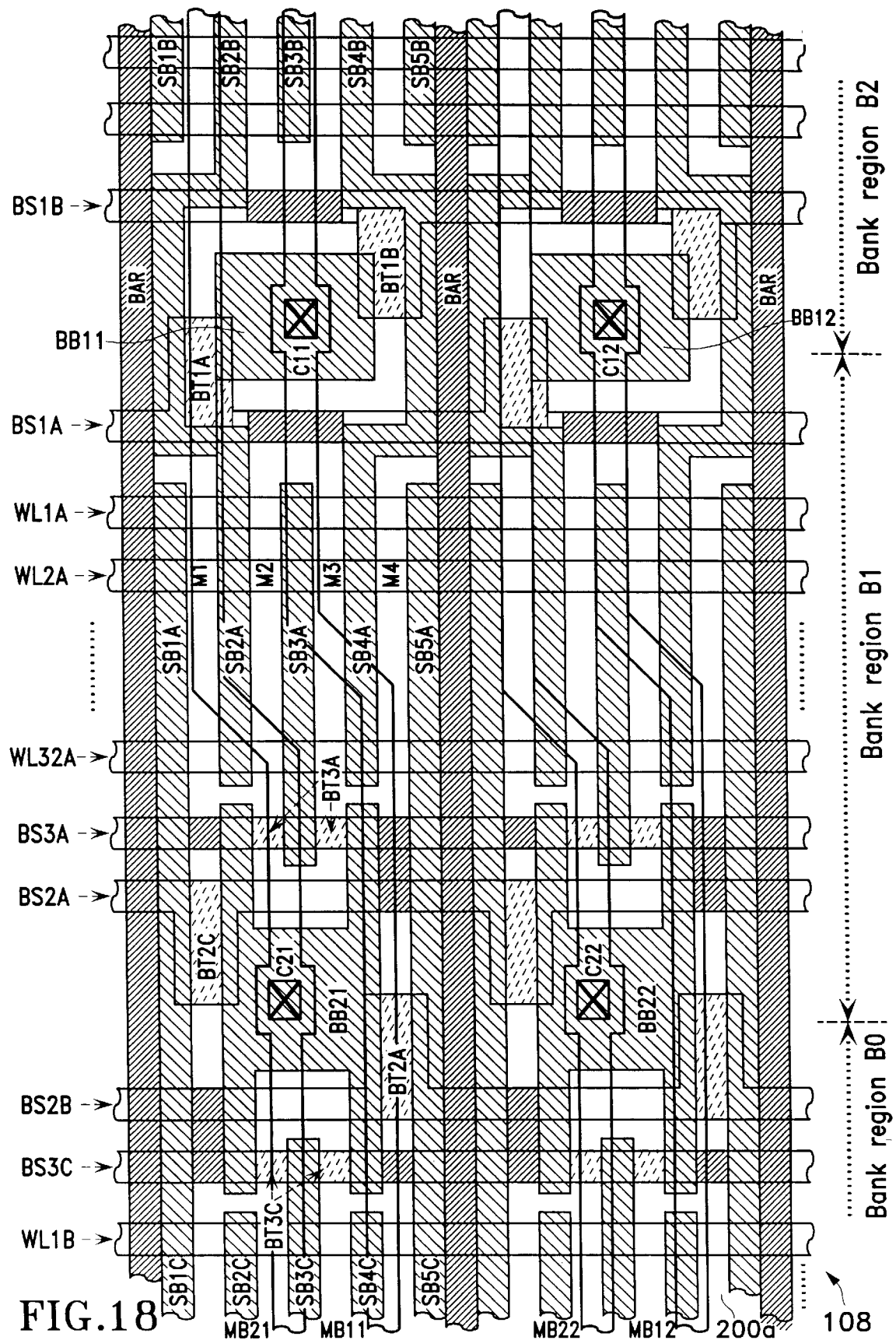
FIG. 18 is a diagram showing an exemplary layout pattern for the respective layers included in the semiconductor memory device in the eighth example of the present invention.
Figure 19:
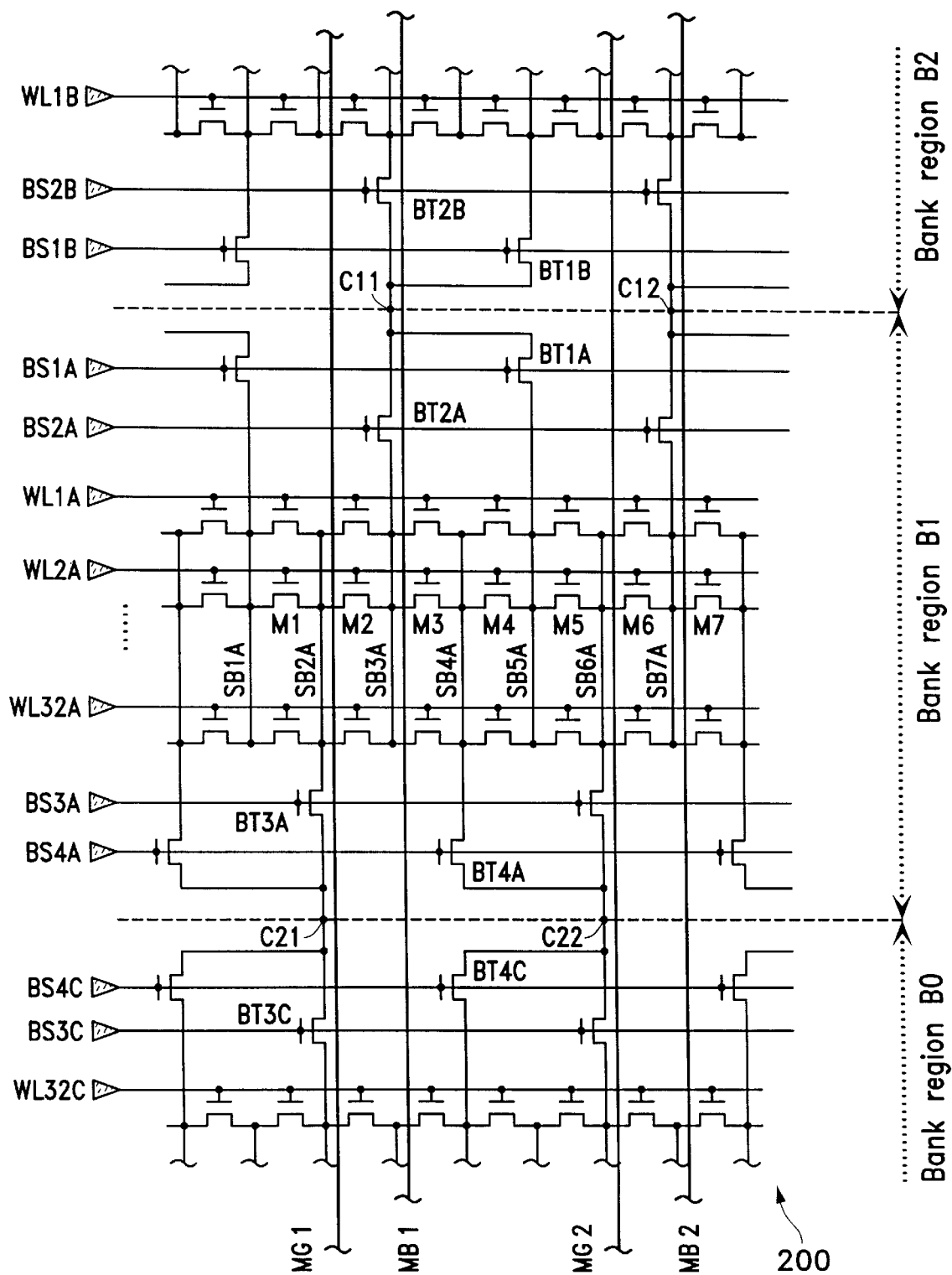
FIG. 19 is an equivalent circuit diagram of a conventional semiconductor memory device.
Figure 20:
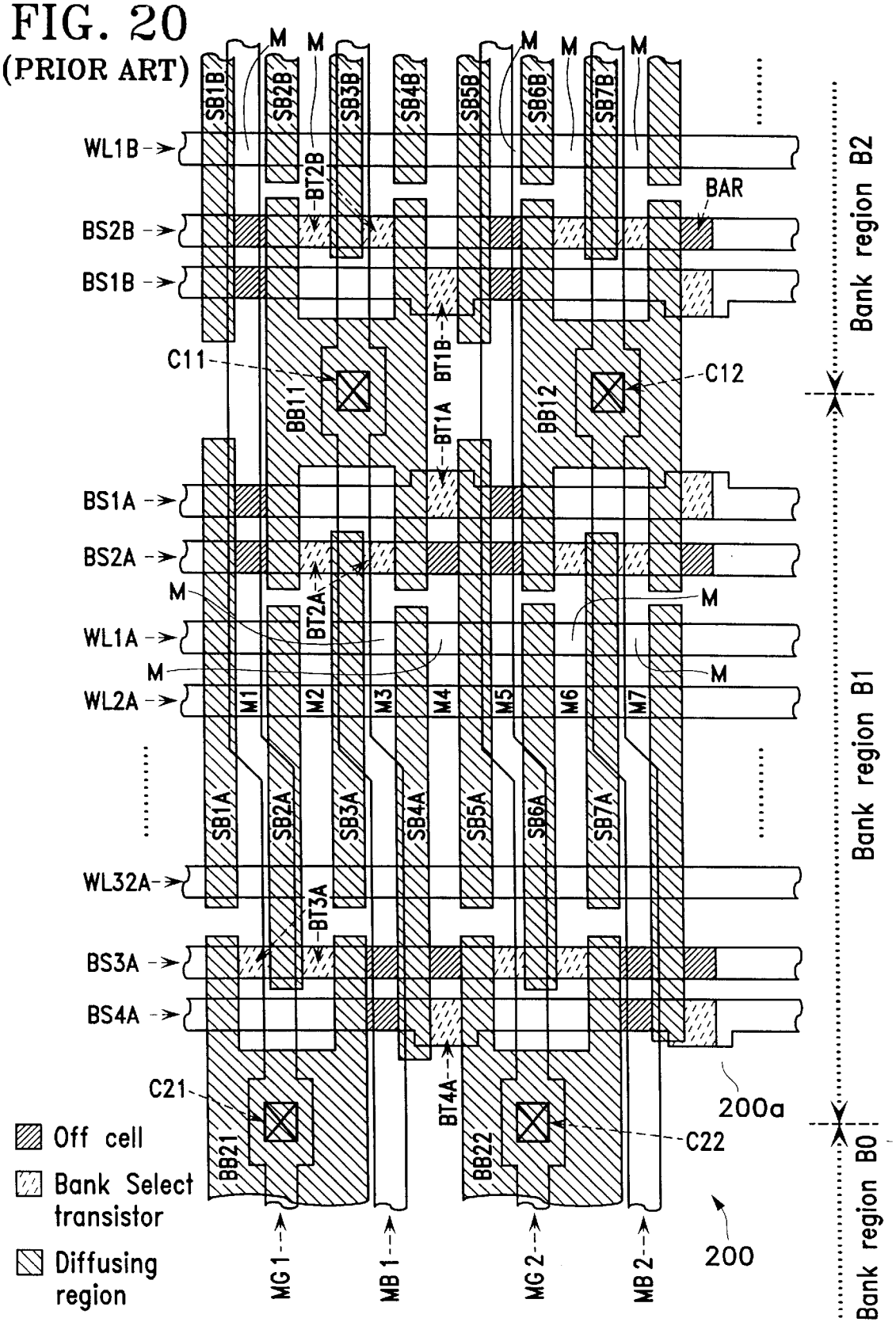
FIG. 20 is a diagram showing an exemplary layout pattern for the respective layers included in the semiconductor memory device shown in FIG. 19.
Figure 2:
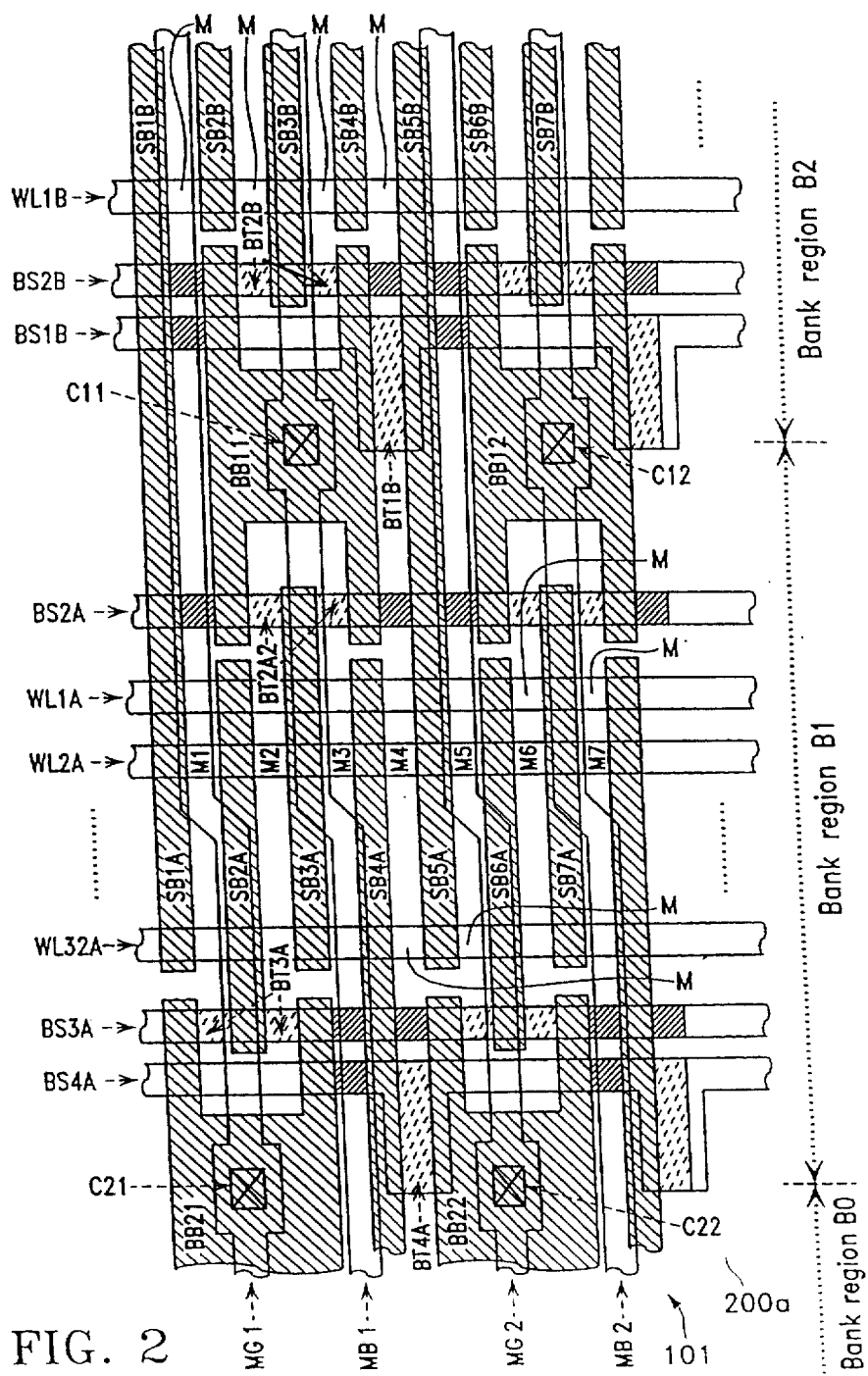
Figure 6:
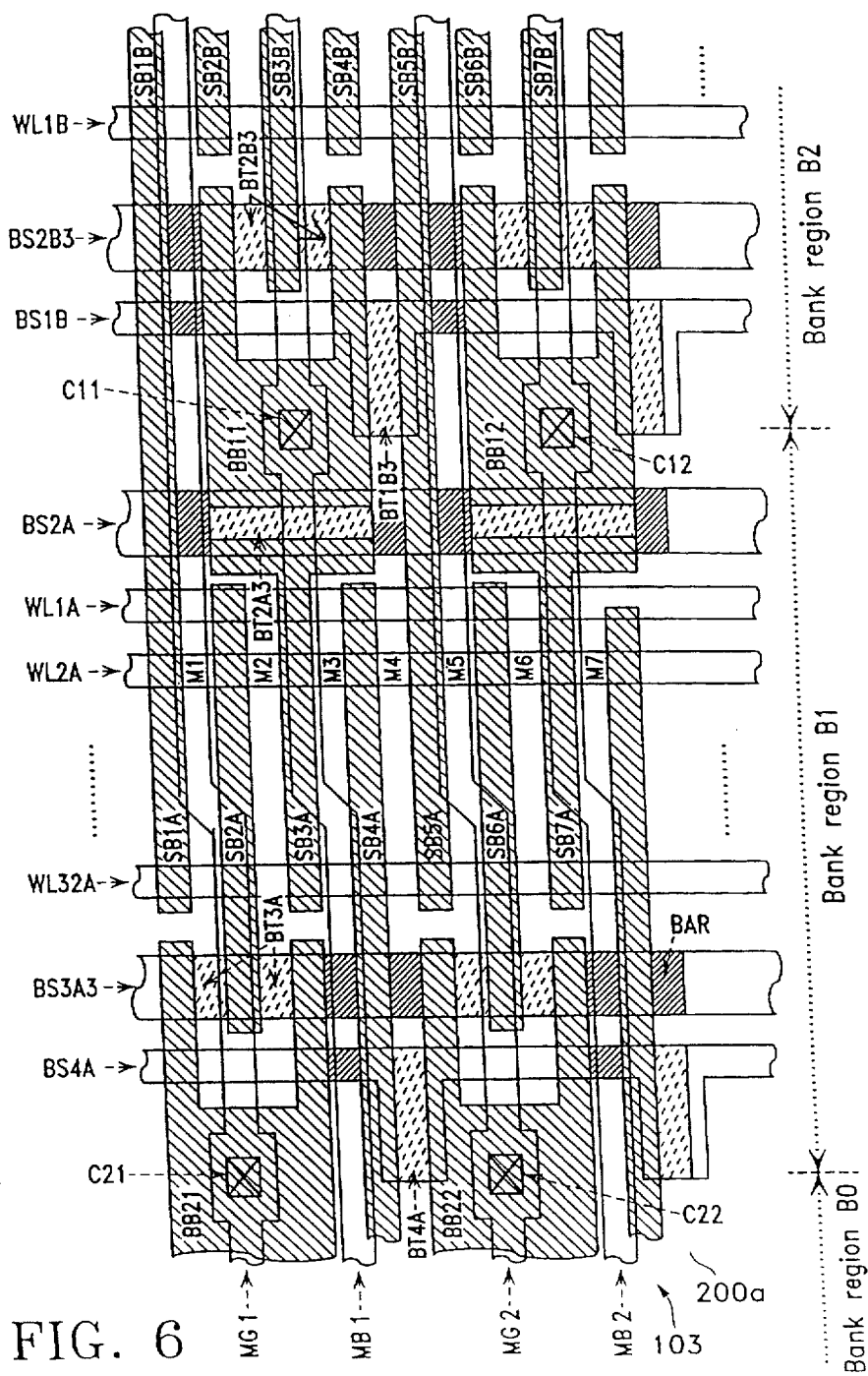
Figure 10:
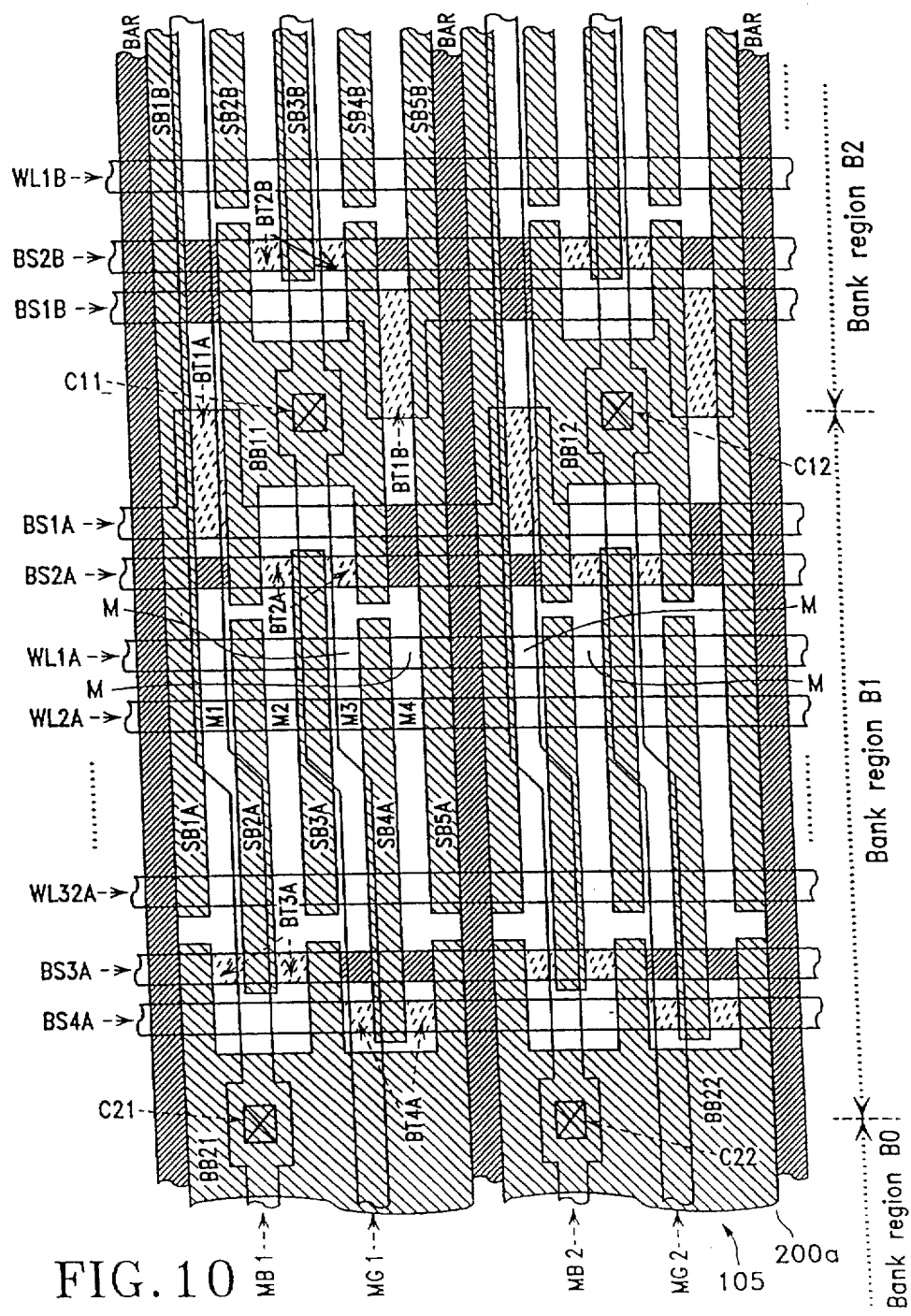

In FIGS. 17 and 18, a ROM 108 is a ROM utilizing the hierarchical bitline arrangement of this eighth example. In this ROM 108, three sub-bitlines SB1A, SB3A and SB5A are connected to a main bitline MB21 via the bank select transistors BT2C, BT3A and BT2A, respectively, while two sub-bitlines SB2A and SB4A are connected to a main bitline MB11 via the bank select transistors BT1A and BT1B, respectively.

A pair of sub-bitlines SB2A and SB2B which are connected to each other is connected to the auxiliary conductive region BB11 commonly used by the adjacent bank regions B1 and B2 via the bank select transistor BT1A. Another pair of sub-bitlines SB4A and SB4B which are connected to each other is connected to the auxiliary conductive region BB11 via the bank select transistor BT1B. Similarly, pairs of mutually connected sub-bitlines are connected to the auxiliary conductive region BB12 commonly used by the adjacent bank regions B1 and B2 via the respective bank select transistors.

On the other hand, a pair of sub-bitlines SB1A and SB1C which are connected to each other and another pair of sub-bitlines SB5A and SB5C which are connected to each other are connected to the auxiliary conductive region BB21 commonly used by the adjacent bank regions B0 and B1 via the bank select transistors BT2C and BT2A, respectively. The sub-bitlines SB3A and SB3C are connected to the auxiliary conductive region BB21 via the bank select transistors BT3A and BT3C, respectively.

Though a single bank select transistor cannot be shared between the sub-bitlines SB3A and SB3C, bank select transistors can be shared between the sub-bitlines SB2A and SB2B, between SB4A and SB4B, between SB1A and SB1C and between SB5A and SB5C. Thus, in this example, the number of bank select lines can be reduced.

On the other hand, the auxiliary conductive regions BB11, BB21, BB12 and BB22 are connected to the main bitlines MB11, MB21, MB12 and MB22 via the contact holes C11, C21, C12 and C22, respectively.

In this eighth example, a set of five sub-bitlines SB1A through SB5A are collectively disposed as one unit. The regions for two adjacent units, each including a set of five sub-bitlines, are electrically isolated from each other via an isolation band BAR subjected to such processing as ion implantation for programming the ROM.

In the foregoing examples, a mask ROM in which a ROM is programmed by an ion implantation has been described. However, it is obvious that the present invention is easily applicable to various types of non-volatile memories such as other mask ROMs and EEPROMs.

As is apparent from the foregoing description, the present invention can advantageously reduce the area of a memory cell array while suppressing the reduction in bitline current to be caused by bank select transistors having a large gate width in a ROM of a hierarchical bitline type. Furthermore, the present invention can advantageously reduce the area of a memory cell array even when the gate width of a bank select transistor is enlarged.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising: a semiconductor substrate; a first block; a second block adjacent to the first block; a main bitline; a first auxiliary conductive region; a first select transistor; and a first select line, wherein the first block comprises:
a first memory transistor having a first electrode, a second electrode and a gate electrode;
a first sub-bitline including a part functioning as the first electrode of the first memory transistor;
a second sub-bitline including a part functioning as the second electrode of the first memory transistor; and
a first word line including a part functioning as the gate electrode of the first memory transistor, while the second block comprises:
a second memory transistor having a third electrode, a fourth electrode and a gate electrode;
a third sub-bitline including a part functioning as the third electrode of the second memory transistor;

a fourth sub-bitline including a part functioning as the fourth electrode of the second memory transistor; and a second word line including a part functioning as the gate electrode of the second memory transistor, and wherein the main bitline is electrically connected to the first auxiliary conductive region, the second sub-bitline and the fourth sub-bitline are electrically connected to each other, thereby forming a common bitline, and the first select transistor electrically connects selectively the electrically connected second and fourth sub-bitlines to the first auxiliary conductive region depending upon a potential on the first select line.

2. A semiconductor memory device according to claim 1, wherein the first block shares the first auxiliary conductive region with the second block.

3. A semiconductor memory device according to claim 1, wherein the first select transistor has a fifth electrode, a sixth electrode and a gate electrode, and wherein a part of the first auxiliary conductive region functions as the fifth electrode, a part of the second sub-bitline and a part of the fourth sub-bitline function as the sixth electrode and a part of the first select line functions as the gate electrode of the first select transistor.

4. A semiconductor memory device according to claim 1, wherein the semiconductor substrate is of a first conductivity type, and wherein the first to the fourth sub-bitlines are of a second conductivity type.

5. A semiconductor memory device according to claim 1, wherein the first block shares the first select line with the second block.

6. A semiconductor memory device according to claim 1, further comprising: a third block adjacent to the second block; a main ground line; a second auxiliary conductive region; a second select transistor; and a second select line, wherein the first select transistor has a fifth electrode, a sixth electrode and a gate electrode, and wherein the third block comprises:

a third memory transistor having a seventh electrode, an eighth electrode and a gate electrode;

a fifth sub-bitline including a part functioning as the seventh electrode of the third memory transistor;

a sixth sub-bitline including a part functioning as the eighth electrode of the third memory transistor; and a third word line including a part functioning as the gate electrode of the third memory transistor, and wherein the main ground line is electrically connected to the second auxiliary conductive region, the third sub-bitline of the second block is electrically connected to the fifth sub-bitline of the third block, and the second select transistor electrically connects selectively the electrically connected third and fifth sub-bitlines to the second auxiliary conductive region depending upon a potential on the second select line.

7. A semiconductor memory device according to claim 6, wherein the second block further comprises a seventh sub-bitline and a fourth memory transistor having a ninth electrode, a tenth electrode and a gate electrode, and wherein a part of the third sub-bitline functions as the ninth electrode of the fourth memory transistor, a part of the seventh sub-bitline functions as the tenth electrode of the fourth memory transistor, and a part of the second word line functions as the gate electrode of the fourth memory transistor.

8. A semiconductor memory device according to claim 7, wherein the second block further comprises a third select line disposed in parallel to the first select line via the first auxiliary conductive region and a third select transistor having an eleventh electrode, a twelfth electrode and a gate electrode, and wherein a part of the first auxiliary conductive region functions as the eleventh electrode, a part of the seventh sub-bitline functions as the twelfth electrode, and a part of the third select line functions as the gate electrode of the third select transistor.

9. A semiconductor memory device according to claim 8, wherein a side of the eleventh electrode of the third select transistor facing the twelfth electrode of the third select transistor is parallel to an elongation direction of the second word line.

10. A semiconductor memory device according to claim 8, wherein a side of the fifth electrode of the first select transistor facing the sixth electrode of the first select transistor is parallel to an elongation direction of the third sub-bitline.

11. A semiconductor memory device according to claim 8, wherein a side of the eleventh electrode of the third select transistor facing the twelfth electrode of -the third select transistor is parallel to an elongation direction of the second word line, and wherein a side of the fifth electrode of the first select transistor facing the sixth electrode of the first select transistor is parallel to an elongation direction of the third sub-bitline.

12. A semiconductor memory device according to claim 8, wherein an effective channel width of the first select transistor is equal to an effective channel width of the third select transistor.

13. A semiconductor memory device comprising: a semiconductor substrate; a first block; a second block adjacent to the first block; a first main bitline; a first auxiliary conductive region; a first select transistor; and a first select line, wherein the first block comprises:

a first memory transistor having a first electrode, a second electrode and a gate electrode;

a first sub-bitline including a part functioning as the first electrode of the first memory transistor;

a second sub-bitline including a part functioning as the second electrode of the first memory transistor; and a first word line including a part functioning as the gate electrode of the first memory transistor, while the second block comprises:

a second memory transistor having a third electrode, a fourth electrode and a gate electrode;

a third sub-bitline including a part functioning as the third electrode of the second memory transistor;

a fourth sub-bitline including a part functioning as the fourth electrode of the second memory transistor; and a second word line including a part functioning as the gate electrode of the second memory transistor, and wherein the first main bitline is electrically connected to the first auxiliary conductive region, the second sub-bitline and the fourth sub-bitline are electrically connected to each other, thereby forming a common bitline, the first select transistor electrically connects selectively the electrically connected second and fourth sub-bitlines to the first auxiliary conductive region depending upon a potential on the first select line, and wherein the first block further comprises:
a second select transistor having a fifth electrode comprising first and second parts, a sixth electrode and a gate electrode; and
a second select line for activating the second select transistor,
and wherein a part of a fifth sub-bitline functions as the sixth electrode of the second select transistor,
a part of the first auxiliary conductive region functions as the first part of the fifth electrode of the second select transistor,
another part of the first auxiliary conductive region functions as the second part of the fifth electrode of the second select transistor, and
the second select transistor electrically connects selectively the first auxiliary conductive region to the fifth sub-bitline depending upon a potential on the second select line.

14. A semiconductor memory device according to claim 13, wherein the first part of the fifth electrode is parallel to the second part of the fifth electrode.

15. A semiconductor memory device according to claim 13, wherein an effective channel width of the second select transistor is equal to an effective channel width of the first select transistor.

16. A semiconductor memory device according to claim 1, further comprising a forbidden band adjacent to the second and the fourth sub-bitlines.

17. A semiconductor memory device according to claim 13, further comprising a forbidden band adjacent to the second and the fourth sub-bitlines.

18. A semiconductor memory device according to claim 1, wherein the main bitline is electrically connected to the first auxiliary conductive region via a contact hole and the first block is opposed to the second block via the contact hole.

19. A semiconductor memory device according to claim 1, wherein the main ground line is electrically connected to the second auxiliary conductive region via a contact hole and the second block is opposed to the third block via the contact hole.

20. A semiconductor memory device according to claim 13, further comprising a third select transistor and a third select line,
wherein the first block further comprises:
a third memory transistor having a seventh electrode, an eighth electrode and a gate electrode;
a sixth sub-bitline including a part functioning as the seventh electrode of the third memory transistor;
a seventh sub-bitline including a part functioning as the eighth electrode of the third memory transistor; and
the first word line including a part functioning as the gate electrode of the third memory transistor,
while the second block further comprises:
a fourth memory transistor having a ninth electrode, a tenth electrode and a gate electrode;
an eighth sub-bitline including a part functioning as the ninth electrode of the fourth memory transistor;
a ninth sub-bitline including a part functioning as the tenth electrode of the fourth memory transistor; and
the second word line including a part functioning as the gate electrode of the fourth memory transistor,
and wherein the seventh sub-bitline and the ninth sub-bitline are electrically connected to each other, thereby forming a common bit-line,
the third select transistor electrically connects selectively the electrically connected seventh and ninth sub-bitlines to the first auxiliary conductive region depending upon a potential on the third select line,
and wherein the second block further comprises:
a fourth select transistor having an eleventh electrode comprising first and second parts, a twelfth electrode and a gate electrode; and
a fourth select line for activating the fourth select transistor,
and wherein a part of a tenth sub-bitline functions as the twelfth electrode of the fourth select transistor,
a part of the first auxiliary conductive region functions as the first part of the eleventh electrode of the fourth select transistor,
another part of the first auxiliary conductive region functions as the second part of the eleventh electrode of the fourth select transistor, and
the fourth select transistor electrically connects selectively the first auxiliary conductive region to the tenth sub-bitline depending upon a potential on the fourth select line.

21. A semiconductor memory device comprising: a first block; a second block adjacent to the first block; an auxiliary conductive region shared between the first block and the second block, and a main bitline electrically connected to the auxiliary conductive region; and
wherein the first block comprises: a first memory transistor having a first electrode, a second electrode and a gate electrode;
a first sub-bitline including a part functioning as the first electrode of the first memory transistor;
a second sub-bitline including a part functioning as the second electrode of the first memory transistor;
a second memory transistor having a third electrode, a fourth electrode and a gate electrode;
a third sub-bitline including a part functioning as the third electrode of the second memory transistor;
a fourth sub-bitline including a part functioning as the fourth electrode of the second memory transistor; and
a first word line including a part functioning as the gate electrode of the first memory transistor and a part functioning as the gate electrode of the second memory transistor,
while the second block comprises: a third memory transistor having a fifth electrode, a sixth electrode and a gate electrode;
a fifth sub-bitline including a part functioning as the fifth electrode of the third memory transistor;
a sixth sub-bitline including a part functioning as the sixth electrode of the third memory transistor;
a fourth memory transistor having a seventh electrode, an eighth electrode and a gate electrode;
a seventh sub-bitline including a part functioning as the seventh electrode of the fourth memory transistor;
an eighth sub-bitline including a part functioning as the eighth electrode of the fourth memory transistor; and
a second word line including a part functioning as the gate electrode of the third memory transistor and a part functioning as the gate electrode of the fourth memory transistor, wherein the first sub-bitline and the fifth sub-bitline are electrically connected to each other, thereby forming a common bit-line, the fourth sub-bitline and the eighth sub-bitline are electrically connected to each other, thereby forming a common bit-line, a first part of the auxiliary conductive region functions as a ninth electrode of a first select transistor, a part of the electrically connected first and fifth sub-bitlines functions as a tenth electrode of the first select transistor, a second part of the auxiliary conductive region functions as an eleventh electrode of a second select transistor, and a part of the electrically connected fourth and eighth sub-bitlines functions as a twelfth electrode of the second select transistor.

22. A semiconductor memory device according to claim 1, wherein the second block further comprises a fifth sub-bitline and a third memory transistor having a fifth electrode, a sixth electrode and a gate electrode, and wherein a part of the third sub-bitline functions as the fifth electrode of the third memory transistor, a part of the fifth sub-bitline functions as the sixth electrode of the third memory transistor, and a part of the second word line functions as the gate electrode of the third memory transistor.

* * * * *

UNITED STATES PATENT AND TRADEMARK OFFICE
CERTIFICATE OF CORRECTION

PATENT NO. : 5,852,570
DATED : December 22, 1998
INVENTOR(S) : Yasuhiro Hotta, Takeshi Nojima and Koji Komatsu It is certified that error appears in the above-identified patent and that said Letters Patent is hereby corrected as shown below:

In the Drawings, replace sheets 2, 6, and 10 with the following:

Signed and Sealed this

Twenty-fourth Day of August, 1999

Attest:

Q. TODD DICKINSON

*Attesting Officer*   Acting Commissioner of Patents and Trademarks